(12) United States Patent
Schmidt et al.

(10) Patent No.: US 8,120,916 B2
(45) Date of Patent: Feb. 21, 2012

(54) FACILITATING COOLING OF AN ELECTRONICS RACK EMPLOYING WATER VAPOR COMPRESSION SYSTEM

(75) Inventors: Roger R Schmidt, Poughkeepsie, NY (US); Jyunji Takayoshi, Yokohama (JP); Takeshi Tsukamoto, Yokohama (JP); Masayoshi Funatsu, Tokyo (JP); Minoru Onai, Tokyo (JP); Masaaki Imai, Hyogo (JP); Yoshinori Inoue, Hyogo (JP)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 12/561,335

(22) Filed: Sep. 17, 2009

(65) Prior Publication Data

US 2011/0063792 A1    Mar. 17, 2011

(51) Int. Cl.
*H05K 7/20* (2006.01)
*F28D 15/00* (2006.01)
*H01L 23/34* (2006.01)

(52) U.S. Cl. .................. 361/700; 361/679.53; 361/699; 361/725; 361/727; 165/80.4; 165/80.5; 165/104.33; 257/715; 174/15.1; 62/119; 62/259.2

(58) Field of Classification Search .......... 361/679.53, 361/699–700, 724–727; 165/80.4–80.5, 165/104.33; 257/714–716; 174/15.1; 62/119, 62/259.2

See application file for complete search history.

(56) References Cited

U.S. PATENT DOCUMENTS

| | | | | |
|---|---|---|---|---|
| 5,910,160 | A * | 6/1999 | Cakmakci et al. | 62/195 |
| 7,254,957 | B2 * | 8/2007 | Weber et al. | 62/259.2 |
| 7,908,874 | B2 * | 3/2011 | Weber et al. | 62/119 |
| 2007/0209782 | A1 * | 9/2007 | Wyatt et al. | 165/76 |

FOREIGN PATENT DOCUMENTS

| | | | |
|---|---|---|---|
| JP | 3191274 | A | 8/1991 |
| JP | 2002374086 | A | 12/2002 |
| JP | 2005100091 | A | 4/2005 |
| JP | 2006285670 | A | 10/2006 |

* cited by examiner

*Primary Examiner* — Zachary M Pape
(74) *Attorney, Agent, or Firm* — Dennis Jung

(57) ABSTRACT

A cooling apparatus and method are provided for facilitating cooling of an electronic apparatus that includes a semiconductor element. The cooling apparatus includes an evaporator containing a coolant and evaporating the coolant under a reduced pressure lower than an ambient pressure to generate a chilled coolant, a condenser regenerating the coolant from a vapor of the coolant and being fluid-communicated with the evaporator through a bypass line, and a circulating pump and a line supplying the chilled coolant to a heat exchange area of the electronic apparatus to conduct a heat exchange with an air flow passing though the semiconductor element at a hot side of the electronic apparatus and returning the coolant after the heat exchange to the condenser.

14 Claims, 15 Drawing Sheets

FACILITATING COOLING OF AN ELECTRONICS RACK EMPLOYING WATER VAPOR COMPRESSION SYSTEM

CROSS-REFERENCE TO RELATED APPLICATION

This application claims the priority benefit under 35 U.S.C. §119 of Japanese application 2008-240689, filed Sep. 19, 2008, and incorporated herein by reference.

BACKGROUND OF THE INVENTION

1. Field of the Invention

The present invention relates to water cooling of an electronic apparatus and more particularly, the present invention relates to an apparatus and a method for cooling electronics, a coolant shielded electronic apparatus, and a method for cooling electronics.

2. Description of the Related Art

An electronic apparatus including such as a personal computer, a server, a workstation and/or a mainframe computer typically requires a cooling device for cooling a heat source such as a microprocessor unit (hereafter referred to MPU) or a central processing unit (hereafter referred to CPU) to maintain stable performance thereof. In nowadays, operations of the electronic apparatuses in a high performance and a high clock rate are increasingly requested yet and then, the heat generation from the electronic apparatuses rises an old but yet new problem in the computing technology.

The problem is the heat generation of the MPU and/or the CPU and there is a technical prediction that a density of the heat generation of a recent MPU with which the operation clock rate is at about several Giga-Hertz goes over that of an atomic reactor and should reach to the heat generation density of sun in near future.

One strategy to reduce the heat generation problem is to make the MPU and/or the CPU in multi-core architectures so as to reduce instructions per a single core while maintaining an overall performance; however, as the clock rate for the single core goes higher and higher with respect to performance improvements, the trade-off problem between the heat exhaust and processor performance will make a high barrier for the recent processor technology.

Furthermore, recent electronic apparatuses tend to employ a number of the MPUs and/or the CPUs which are operated cooperatively with each other, i.e., so called GRID Computing as well as the multi-core architecture as described above so that an information processing density per an electronic apparatus also increases even if the clock rates for unit MPU and/or CPU is suppressed; this tendency will be further accelerated as the multi-core architecture or the grid-computing between processors becomes more and more popular and as high performance operations for the electronic apparatus are requested.

From the above computing environment, in a data center handling huge amounts of information such as Internet data, information for a search engine, or enterprise data, a number of computing facilities are placed and are operated in the mutual cooperation thereof. Such data center tends to develop the computing performance thereof for addressing to increasing demands for high performance computations so that heat management of the data center becomes a serious problem to be settled urgently in relation to global warming due to the computation as well as reduction of investment costs for the data center.

As another strategy for settling to the heat exhaust from the MPU or the CPU in the electronic apparatus, a direct cooling architecture for the MPU and/or the CPU by an adequate coolant is known.

FIG. 14 shows a typical cooling system 1400 for the electronic apparatus employing an air-cooling mechanism. The cooling system 1400 of FIG. 14 is constructed for cooling the electronic apparatuses while conducting air-conditioning in a computing room. In the space of the computing room, the electronic apparatuses 1440 are placed on the floor 1410 to computing various data. The electronic apparatus 1440 may be, for example, workstations, servers and/or mainframe computers etc.

The chiller units 1420 are placed in the computing room so as to supply chilled air primarily to the space 1450 created under the floor 1410. The space 1450 provides a fluid path for the chilled air etc. The floor 1410 comprises a plurality of perforated panels through which the chilled air can pass upwardly from the space 1450 to the computing room.

Positions of the perforated panels 1430 at the floor 1410 are determined depending on positions of chilled air inlets of the electronic apparatus 1440. The chilled air is supplied into the spaces provided between the electronic apparatus of which air-intake sides, i.e., the cold sides thereof are facing each other.

Referring to FIG. 15, schematic air flows of the cooling apparatus 1500 in FIG. 15 are illustrated. The chilled air 1570 passes the under-floor space 1595 and flows into the computer room from the under floor space 1595 at the position of the perforated panels 1580. The perforated panels 1580 are disposed between the electronic apparatuses positioned to face the cold sides thereof each other.

The chilled air is then drawn into both of the electronic apparatuses from the cold side and conducts the heat exchange with the MPUs and/or the CPUs assembled in the electronic apparatus. Then, the heated air 1590 is discharged from hot sides of both of the electronic apparatuses. Thereafter, the discharged heated air 1590 flows upwardly and then flows laterally toward the CRACs, i.e., Computing Room Air Conditioners 1510, 1560 so as to regenerate the chilled air by air conditioning members within the CRACs 1510, 1560. Then, the chilled air 1570 is again supplied to the under-floor space 1595 for the heat management of the electronic apparatus.

In the described conventional cooling apparatus, the chilled air is mainly used for cooling the MPU and/or the CPU; that is to say, most of the chilled air is consumed for cooling of the electronic apparatus. Then, the air-conditioning in the computing room must be prepared as a separate air conditioning system. Alternatively, the cooling capacity of the CRACs must be increased for settling the entire air conditioning in the computing room.

Direct cooling architecture for the electronic apparatuses have been developed so far for addressing to heat removal of the information processing apparatus. For example, Japanese Patent (Laid-Open) No. 2002-374086 discloses a cooling apparatus for a rack-mounted information processing apparatus. In the scheme disclosed therein, the rack including a water cooling unit is employed and water flow paths are provided in each of columns of a rack cabinet. The water passed through the column is then introduced to the rack and a water cooled jacket for CPU/LSI so as to cool elements within the rack.

Japanese Patent (Laid-Open) No. 2005-100091 also discloses a cooling module disposed directly on the CPU for sharing a water cooling module and a forced air cooling module such that both of the air and water cooling architectures may be switched.

Japanese Patent (Laid-Open) No. 2006-285670 also discloses a blade for information processing and an information processing apparatus including the blade. The disclosed blade is cooled by the water passing through water paths provided in the blade. The CPU or other heat sources are placed on the blade in heat exchange relation to the blade and hence, the heat sources are cooled by the water cooled blade.

As described above, the water cooling architecture is regarded as suitable for the cooling architecture of the electronic apparatus; however, it is known that water has potential defects for causing an electronic leak when the water immerses into the electronic apparatus. When the water is leaked in the enclosure of the electronic apparatus, the electric apparatus or facilities such as a data center would suffer huge and high cost damages.

In order to settle to the leak of the water, many attempts have been made so far. For example, Unexamined (Laid-Open) Japanese Publication No. 3191274 (also published as Japanese Patent (Examined) Publication No. 7-117330), discloses a cooling apparatus which comprises, in a recycle path of a liquid cooling media, a removal apparatus for corrosive ions. The removal apparatus disclosed may remove selectively anions acting corrosive factors to improve the corrosion of the cooling apparatus.

Although attempts for improving hazardous water leak from the cooling system of the electronic apparatus have been made, corrosion mechanisms of lines etc. are not yet understood sufficiently. Thus, the protection from the problems caused by the corrosion under various conditions is not yet practically ensured, because the corrosions and their magnitudes substantially depend on particular environments in which the electronic apparatuses are placed.

In addition, factors for causing the water leak may include, other than the corrosion, for example, cracks or damages by impacts as well as loosed joint connections such that it is difficult to settle the above various factors and to overcome the adverse effects when all of the above factors are considered.

Consequently, an effective cooling apparatus is yet requested and the needs thereof becomes larger and larger as the high performance computing paradigm becomes realized by advances of device and information technologies while providing the heat management of the data center. Further yet there are increasing needs for overcoming the heat exhaust of the electronic apparatuses and thence, a novel cooling apparatus for electronic apparatus including the MPU and/or the CPU has still been expected.

BRIEF SUMMARY OF THE INVENTION

Then, an object of the present invention is to provide an apparatus for making it possible to remove heat around the MPU and/or the CPU effectively and safely without the leak of cooling media such as water while reducing environmental loads caused by computations.

Furthermore, another object of the present invention is to provide a method for cooling an electronic apparatus suitably applied to a data center where a number of electronic apparatuses such as microcomputers, workstations, servers and mainframe computers are arranged together in order to handle valuable information cooperatively.

Still further another object of the present invention is to provide a coolant shielded electronic apparatus for suppressing the heat exhaust from the electronic apparatus to outer environment, in turn, for suppressing power consumption of the data center so as to contribute to global warming.

For settling the problems of the above described conventional cooling apparatuses, the present invention may provide an apparatus for cooling an electronic apparatus adopting a latent heat cooling apparatus of coolants such as water under a reduced pressure with respect to an ambient atmosphere pressure.

In an embodiment of the present invention, an apparatus for cooling an electronic apparatus may be provided. The electronic apparatus comprises a semiconductor element such as MPU and/or CPU cooled by the chilled coolant. The coolant is chilled by the latent heat of the evaporation thereof in an evaporator under a reduced pressure condition with respect to the atmosphere pressure around the electronic apparatus. When the evaporation of the coolant occurs in the evaporator, the coolant still in liquid phase is chilled because of the removal of the latent heat to prepare a chilled coolant.

A pressure reduction in the evaporator is attained by a compressor connected by a bypass line with which communicates an evaporator and a condenser of the coolant.

The chilled coolant is then circulated through a line extending inside a casing, a rack and/or computing nodes of the electronic apparatus such as, for example, a microcomputer, an enterprise server, a workstation, or a mainframe computer etc. to cool an air flow discharged from the electronic apparatus such that the discharged air flow from the electronic apparatus may not provide severe adverse effects to the air-conditioning capacity in a space such as a computing room in which the electronic apparatus is placed.

Further according to the present invention, the coolant may be kept under the ambient atmosphere pressure in the region for conducting the heat exchange with the electronic apparatus and may be supported by a flow control member disposed at an up-stream of side of said heat exchange area for settling an un-predictable water leak. Therefore, the possibility of a coolant leak may be minimized.

The coolant after the heat exchange with a cooling air flow is returned to the evaporator for subjecting repeatedly under the reduced pressure to regenerate the chilled coolant.

The condenser being in fluid-communication with the evaporator receives pressurized vapor of the coolant at the downstream of the compressor and a vacuum pump is connected to the condenser for balancing the pressure in the condenser while reducing a back pressure downstream the compressor. The coolant in the condenser is cooled to about an ambient temperature by a cooling tower, other suitable cooling facilities, or a heat exchanger reservoir.

In another embodiment of the present invention, a coolant shielded electronic apparatus may be provided. The coolant shielded electronic apparatus comprises a computing node including members comprising for computing information a semiconductor element, a memory, an I/O unit, a bus, a rack for holding the computing unit. The coolant shielded electronic apparatus further comprises a pair of sidewalls and the sidewalls each allows the coolant to pass therein. To the coolant shielded electronic apparatus, a door heat exchanger panel is detachably attached to a casing for enclosing the computing node and the rack. The door heat exchanger panel receives the coolant and comprises a serpentine heat exchanger coil in which a pressure of the coolant being kept under an ambient pressure.

Furthermore, the coolant shielded electronic apparatus further may comprise a cold section disposed in the computing node and a fan. The cold section is cooled by the coolant while conducting a heat exchange with an air flow passing through said computing node. The fan causes the ambient air to flow into the computing node to form the air flow toward a discharge side of the casing for cooling said members inside the computing node.

In yet another embodiment of the present invention, a method for cooling an electronic apparatus including a semiconductor element may be provided. The method comprises the steps of;

generating a chilled coolant with a reduced pressure lower than an ambient pressure, circulating said chilled coolant through a line passing though a heat exchange area within said electronic apparatus at a hot side of said electronic apparatus, conducting a heat exchange at said heat exchange area with an air flow passing through said semiconductor element, and returning said coolant after said heat exchange to a condenser for regenerating said coolant from a vapor of said coolant, wherein a pressure of said coolant is kept under said ambient pressure at said heat exchange area with said air flow.

Hereafter the present invention will be described using embodiments depicted in drawings; however, the drawings described hereinafter can be understood only for descriptions of the present invention and do not provide any limitation on the present invention.

BRIEF DESCRIPTION OF THE SEVERAL VIEWS OF THE DRAWING(S)

DETAILED DESCRIPTION OF THE INVENTION

Figure 1:
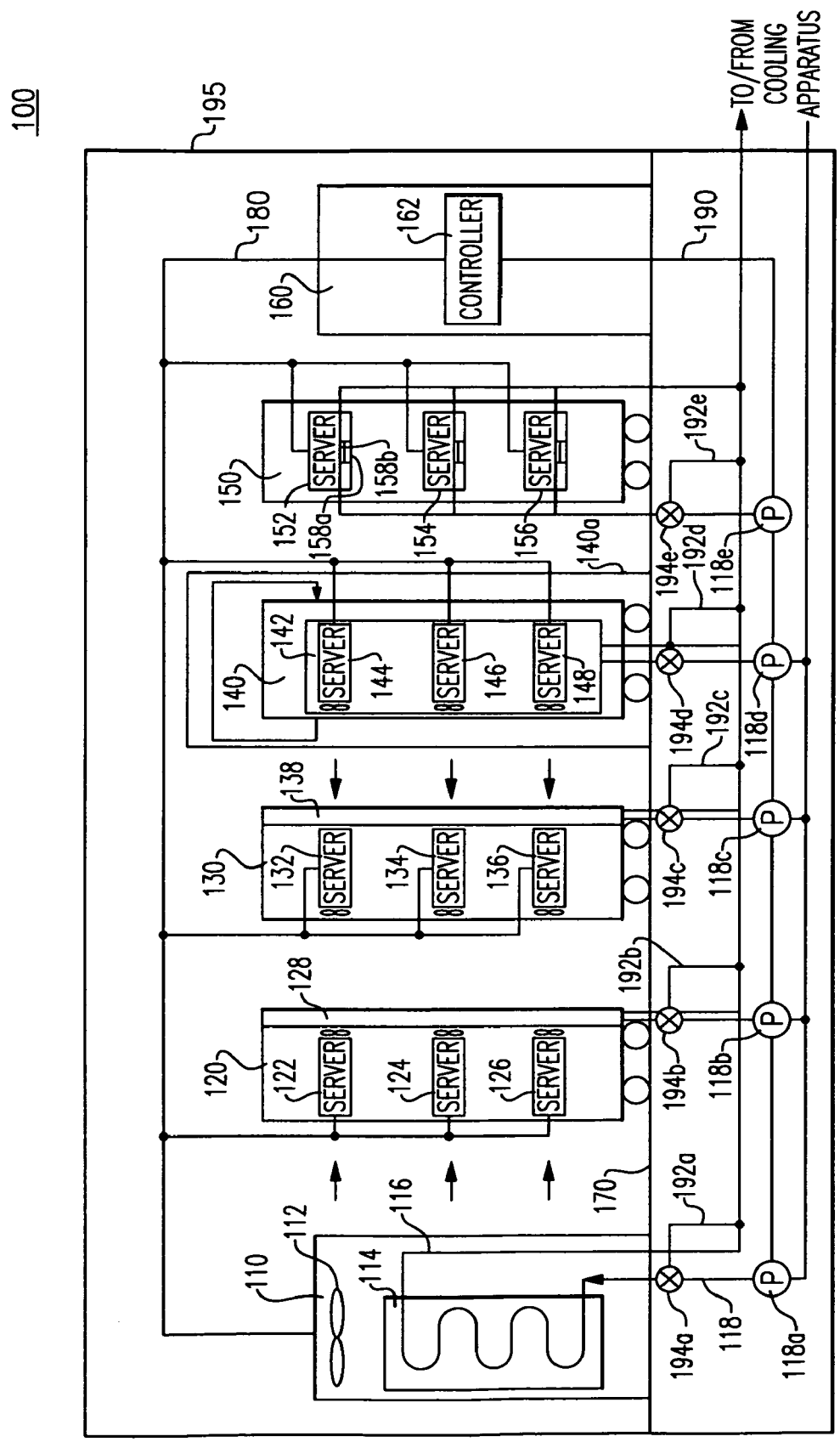
FIG. 1 shows a computing room air-conditioned by a data center control system including an apparatus of the present invention.

FIG. 1 generally shows a data center control system with which an apparatus, a method, and a shielded electronic apparatus are implemented. The data center control system 100 comprises a CRAC 110, a plurality of electronic apparatuses 120-150, and an automated environment monitoring facility (hereafter referred to AOEMF) 160. The above apparatuses are placed on a floor panel 170 offset from a floor slab plate to form a space for utility lines. The floor panel 170 may have a perforated section to introduce the chilled air supplied through the space.

The CRAC 110 conducts an air condition in the computing room 195 as well as the heat management of the apparatuses in the computing room 195. The CRAC 110 receives chilled coolant through a supply line 118 from a building backbone air conditioning system. The air in the computing room 195 is introduced into the CRAC 110 by a fan 112 and is returned into the computing room 195 after the heat exchange at the heat exchanger 114.

Into the heat exchanger 114, the chilled coolant such as water is supplied so as to conduct the heat exchange with the air introduced into the CRAC 110 and then, a temperature of the coolant is raised because of the heat exchange. The heated coolant is then, returned to a cooling apparatus of the present invention to regenerate the chilled coolant. The coolant may be selected from conventionally known cooling media such as, for example, Freon such as CFC, HCFC and HFC, or natural medium such as, for example, hydro-carbon, ammonia, carbon dioxide, air, and water; however, water is the most possible candidate as the coolant in the global environment and effects on human heath. In the most preferred described hereunder, the present invention will be described such that the coolant is assumed as water.

The electronic apparatus, in the described embodiment, comprises a plurality of computing units 120-150, but not limited thereto, any other electronic apparatus such as a router, a printer may be present in the computing room 195. The computing units each include servers 122-126, 132-136, 144-148, and 152-156. Each of the servers includes at least MPU, a memory such as RAM and/or ROM, and an I/O interface and the cooled air is introduced into each of the servers 122-126, 132-136, 144-148, and 152-156 by the fans each disposed adjacent to the servers.

In the embodiment described in FIG. 1, the computing units 120-150 include different cooling architectures. The embodiment of FIG. 1 is only an example for the variation of the cooling architectures, and the cooling architecture of the present invention may be different among the computing units and in the other embodiment. The cooling architecture of one type selected from the architectures described in FIG. 1 may be installed in the datacenter. As for example, the computing unit 120 comprises a rear door heat exchanger 128 which is detachably attached to a casing or a rack of the computing unit 120. When the rear door heat exchanger 128 is used, the air passed through the servers 122-126 is discharged into the computing room 195 after the heat exchange by the rear door heat exchanger 128. The chilled water from a cooling apparatus of the present invention is introduced into the rear door heat exchanger 128 and after the heat exchange between the discharged air from the servers 122-126, the water is returned to the cooling apparatus to regenerate the chilled water. The rear door heat exchanger 128 of the computing unit 120 typically removes about 50% of a heat lead of the server 120. Detailed construction of the cooling apparatus will be explained elsewhere.

In turn, to the computing unit 130, the front door heat exchanger 138 is disposed. The front door heat exchanger 138 substantially has the same construction as the rear door heat exchanger and the chilled water is introduced therein and the heated water is returned to the cooling apparatus of the present invention after the heat exchange with the discharged air from the computing unit 130. The above rear door heat exchanger 128 and the front door heat exchanger 138 are hereafter generally referred to a door heat exchanger (hereafter referred to DHEX) and detailed constructions of the cooling apparatus and the DHEX will be explained elsewhere.

Further another implementation is adopted in the computing unit 140. The computing unit 140 is constructed in the architecture herein named as a sidecar. The computing unit 140 encloses the air in the enclosure 140a of the computing unit 140. A server rack 142 within the enclosure 140a is constructed as the heat exchanger to which the water from the cooling apparatus is circulated through water paths formed in the rack 142. The air discharged from the servers is circulated within the enclosure so that the heat exhaust from the computing unit 140 may essentially be cut-off by controlling heat balances. In the case of the sidecar type architecture, heat load of the server may be removed to about 100% when the heat discharge from the computing unit 140 is ideally shielded in the enclosure 140a.

Yet another implementation embodiment is provided in FIG. 1. The computing unit 150 comprises a plurality of servers each of which includes a cold plate 158a disposed in the heat exchange relation with the MPU 158b. The chilled water from the cooling apparatus is introduced to the cold plate 158a to cool the MPU 158b and then is returned to the cooling apparatus to regenerate the chilled water. The above plurality of computing units 110-150 are supplied with coolant water through the pump series 118a-118e; each supplying the water under the ambient atmospheric pressure through independent lines. The pumps 118a-118e are preferably selected from non-volume type pump such as turbo-type pumps, centrifugal-type pumps, and/or screw-type pumps, acting also as a flow control member, to allow the reverse flow of the water even if an unpredictable water leak would occur to raise a forward pressure of the pumps, i.e., the down stream sides of each pumps up to the atmospheric pressure. In another embodiment, a flow control member explicitly depicted in FIG. 1 may be disposed to the datacenter control system 100. The flow control member each comprises the line 192a-192e connected to the upstream side of the heat exchanger member through a pressure sensitive valves 194a-194e for returning the water to the reduced pressure side of the water return line for settling emergency water leak. The pressure sensitive valves 194a-194e are activated when the pressure difference across the inlet and outlet sides becomes equal or larger than a predetermined pressure threshold of 0.01 MPa-0.101325 MPa for settling the pressure rise in the heat exchange region in the computing units 120-150. The threshold value may be adequately set depending on particular applications and the pressure sensitive valves 194a-194e may be controlled by the controller 162.

Further to the above computing units, the data center control system 100 comprises the AOEMF 160 and the AOEMF 160 includes a controller 162 to detect at least one temperature selected from the temperature of the ambient air temperature in the computing room 195, the temperatures of the servers and the temperatures of the MPUs through the detection lines 180, 190. The controller 162 feed-backs the detected results to the control of the elements of the cooling apparatus of the present invention to maintain the air condition in the computing room 195 at a predetermined level. The AOEMF 160 may include the cooling architecture which is attached to any one of the computing units 120-150.

Figure 2:
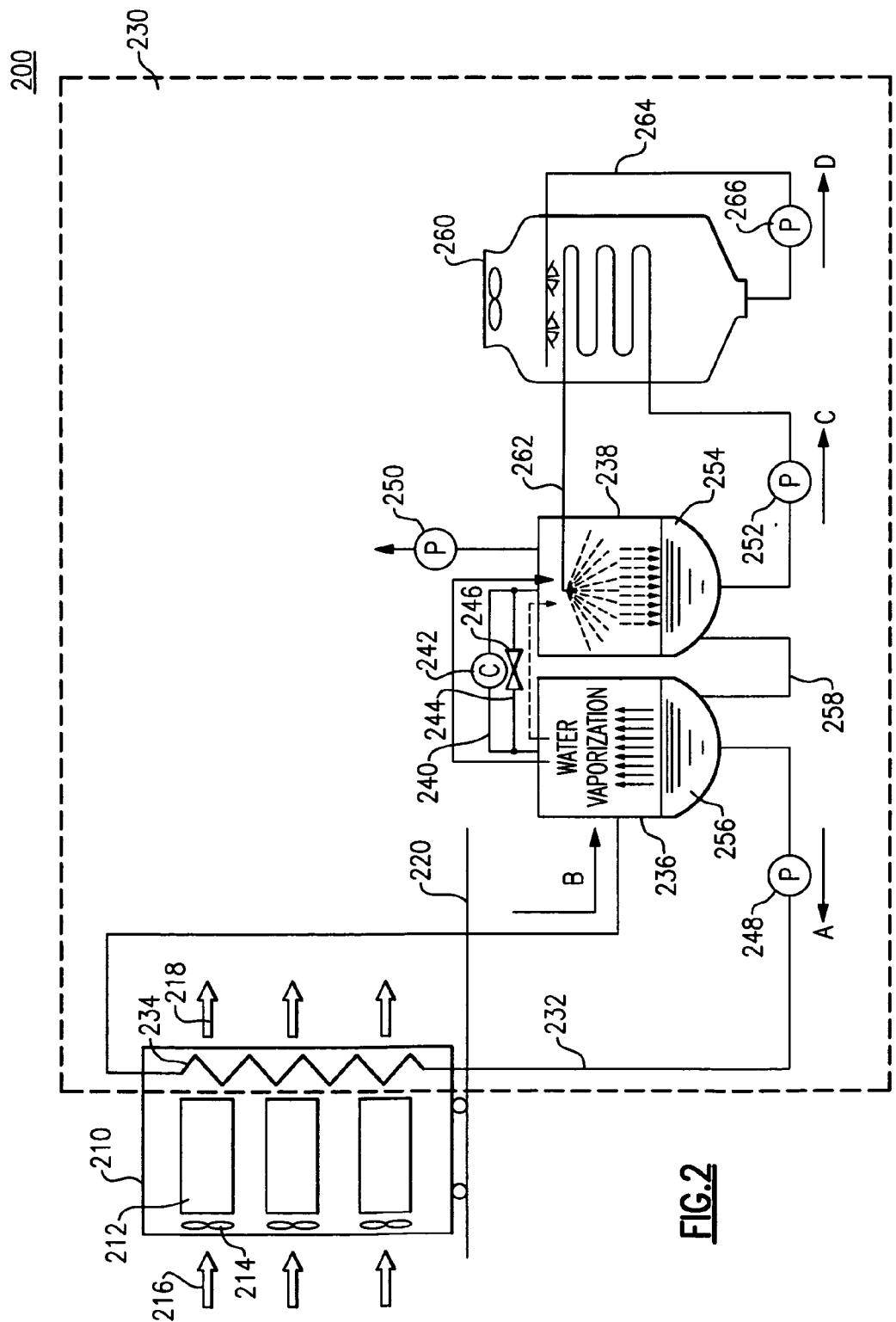
FIG. 2 shows a general construction of a cooling apparatus.

Now, referring to FIG. 2, a general construction of the cooling apparatus 200 is depicted. The cooling apparatus 200 comprises an electronic apparatus 210, a water vapor compression chiller unit (hereafter referred simply to WCU) 230 comprising the members enclosed in the rectangle of dashed line. The electronic apparatus 210 comprises at least a MPU and/or a CPU and returns outside results of computations to provide variable information or to control outer devices.

Figure 14:
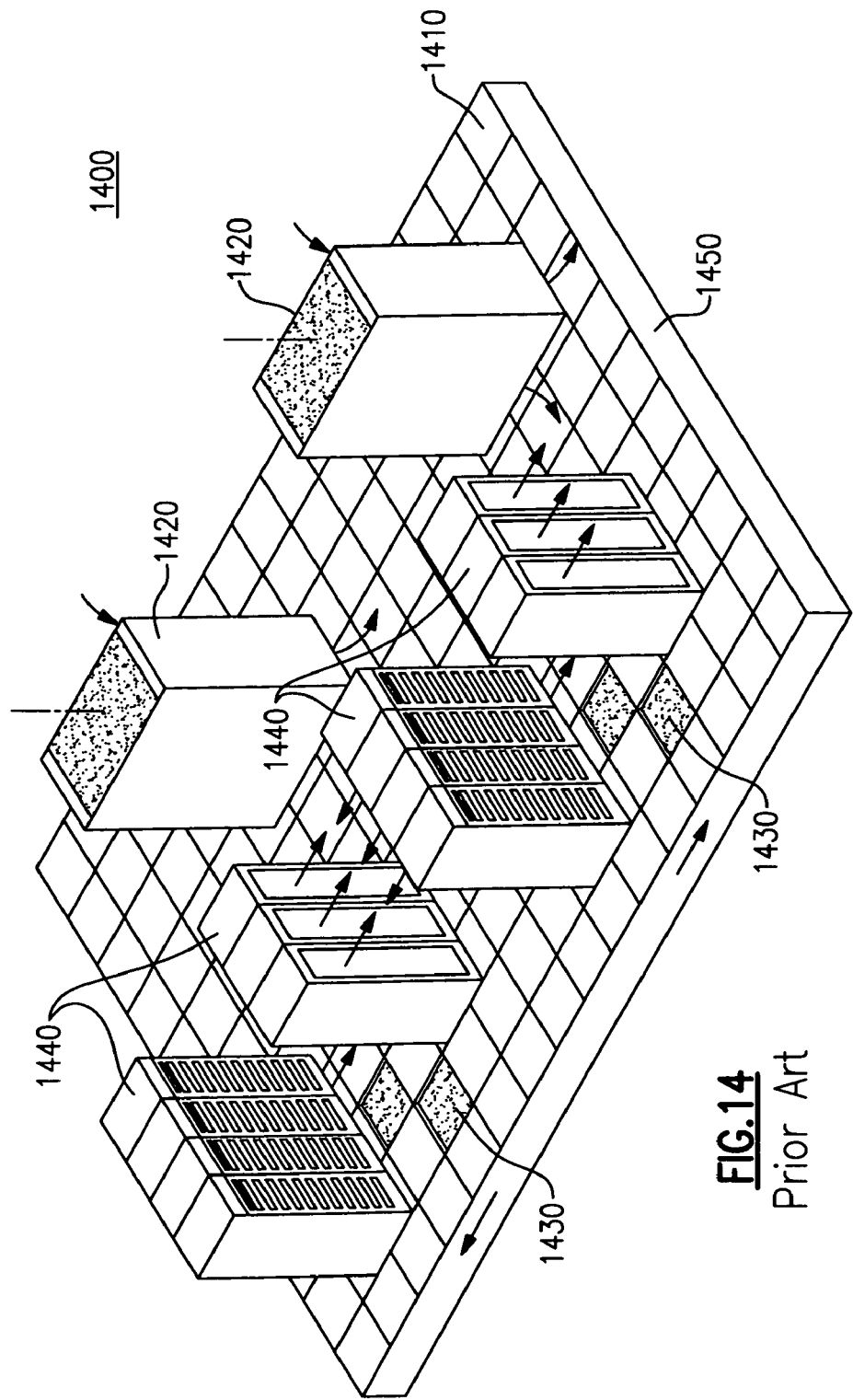
FIG. 14 shows a typical cooling apparatus for the electronic apparatus.
Figure 15:
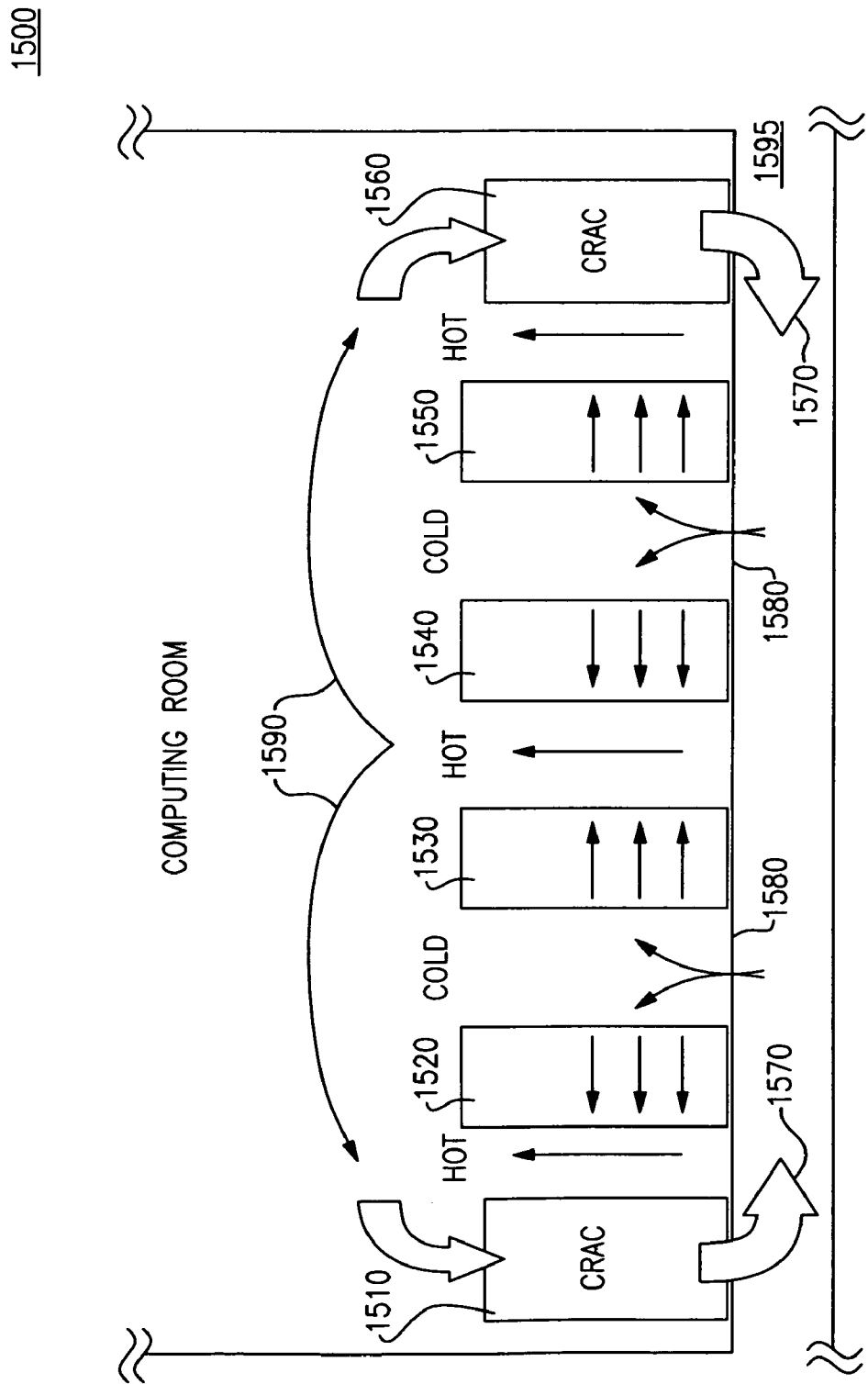
FIG. 15 shows a schematic air flow of the cooling apparatus of FIG. 14.

The electronic apparatus 210 may be selected generally from computers such as, for example, a personal computer, a server, a workstation, a mainframe computer, a peripheral interface, or any other combinations thereof and is placed on the floor 220. The floor 220 may have perforated panels to introduce the cooled air supplied by a separate A/C system when such A/C system is already installed as described in FIG. 14. The cooling apparatus 200 may be preferably constructed in the data center of any building or on an underground tunnel where a number of computers are managed to compute various and valuable information.

The electronic apparatus 210 generally comprises sets including a computing node 212 and the fan 214. The fan 214 creates the air flow 216 at an ambient temperature in the computing room flowing through the computing node 212 indicated by the arrow. The term "computing node" herein refers to a member of the electronic apparatus 210 which plays a major role in the computation and encloses the MPU and/or CPU as well as memories and interfaces therefore in an adequate package. When the electronic apparatus is a server, a plurality of the computing units 212 are enclosed therein to provide requested functions of the servers.

The air flow passed through the computing node 212 is discharged as the air flow 218 after cooled to about an ambient temperature by the heat exchanger coil 234 according to the present embodiment. In another embodiment, the fan 214 may be placed at the right side of the electronic apparatus 210 (a hot side) rather than at the left side (a cold side) thereof. In this embodiment, the fan draws the air from the computing node 212 toward the heat exchanger coil 234 and passing through the heat exchanger coil.

The heat exchanger coil 234 extends through the electronic apparatus 210 such that the heated air after the heat exchange between MPUs etc. may be readily subjected to the heat exchange process with the heat exchanger coil 234. The region in the electronic apparatus in which the heat exchanger coil 234 extends defines a heat exchange region in the electronic apparatus. In the described embodiment, the heat exchanger coil 234 provides the function to prevent the hot air from direct discharge to the computing room and then, the electronic apparatus 210 may not provide significant additional heat loads to a backbone cooling apparatus for the data center to which the electronic apparatus 210 is placed.

The WCU 230 generates the chilled water to be supplied to the electronic apparatus 210 and comprises an evaporator 236 and a condenser 238 containing water as the coolant medium. The evaporator 236 evaporates the water under a reduced pressure condition being lower than an atmospheric pressure or an ambient pressure in the computer room in which the electronic apparatuses are placed. The condenser 238 is disposed in fluid-communication with the condenser 236 through a plurality of bypass lines and returns the water vapor transferred from the evaporator 236 to the liquid phase.

The evaporator 236 and the condenser 238 are fluid-communicated by a connection line 258 so as to keep the water levels 254, 256 balanced to stabilize the head of the circulation of the water through the cooling apparatus.

The residual spaces in the evaporator 236 and the condenser 238 are also fluid-communicated by the bypass lines 240, 244 each including the compressor 242 and the bypass valve 246. As described above, the evaporator 236 acts as a refrigerator for cooling the water therein by the latent heat of the evaporation of water. For the purpose for cooling, the residual space in the evaporator 236 is evacuated by the compressor 242. The bypass valve 246 controls the pressure reduction level within the evaporator 236 by changing a valve open level. In turn, the condenser 238 is evacuated by the vacuum pump 250 through the fluid-connected line to the condenser 238 so as to make the pressure of the residual space in the condenser 238 at a steady state for accounting the pressurized water vapor transferred from the compressor 242.

The compressor 242 may be selected from any type of compressors or pumps. In the explained embodiment, the compressor 242 may be a mechanical booster pump which compresses the medium by a set of symmetric and same shaped rotors close adjacent each other with a phase difference of pai/2 radian. Also the bypass valve 246 may be selected from any valve as far as the valve may provide the fluid-communication with a controlled range between the evaporator 236 and the condenser 238.

The pressure in the evaporator 236 hence becomes the reduced pressure. Upon the evaporation of the water, the latent heat of the water is removed from the water at the liquid phase within the evaporator 236. Thus, the WCU 230 may generate the chilled water having suitable temperature range due to the evaporation rate of the water and the latent heat upon the evaporation. Such temperature of the chilled water may range from 0 Celsius degrees to an ambient temperature of the computer room, more preferably the temperature may range from 0 Celsius degrees to 25 Celsius degrees, and most preferably, the temperature may be set with the temperature offset lower than the temperature of the ambient temperature in the computing room, that is to say; the predetermined offset value depending on a particular setting of the backbone A/C system of the data center.

Such predetermined offset temperature may be set depending on a particular condition, and typically for the computation unit, the predetermined offset value may range from about 10 Celsius degrees to about 20 Celsius degrees. Lower temperature may be feasible for cooling efficiency because a large temperature difference enhances the heat exchange efficiency; however, when the water temperature goes too low beyond predetermined temperature difference, condensation of water from the ambient air may occur.

In turn, higher temperature than ambient temperature is not attained in the present embodiment because the cooling apparatus does not comprise a heating element for the water. Then, the present invention may be readily operated between the temperature not causing water condensation and the ambient temperature. The evacuation rate of the evaporator 236 by the compressor 242 and the cooperatively controlled bypass valve 246 is hence maintained by considering the temperature of the chilled water to avoid the condensation of the water from the ambient air and a pressure difference to rift a water level to the top of the upper most position of the line 232 while keeping the pressure lower than the ambient atmospheric pressure which is typically 0.101325 MPa. The pressure condition of the water will be detailed hereinafter.

In another embodiment of the cooling apparatus of FIG. 2, it may be possible to dispose a plurality of pressure sensors to the line 232 such that the water pressure in the line can be monitored. In this embodiment, a controller unit (not shown) for the cooling apparatus 200 monitors the in-line pressure and controls the operation of the compressor 242 and an opening level of the valve 246 to keep the in-line pressure to be under the atmosphere pressure during the operation time range. Also the controller unit such as the AOEMF 160 may check the water leak from fluctuations of the in-line pressure to alarm a system manager.

The water 254 in the condenser 238 is supplied to the cooling tower 260 for the temperature conditioning. The temperature conditioned coolant water by the cooling tower 260 is circulated through the line 262 and returned by showering into the condenser 238.

The cooling tower 260 may be constructed separately from another cooling tower for the building backbone A/C line. Alternatively, while the COP of the cooling apparatus becomes higher than the most preferred embodiment, the cooling tower 260 may be shared with the cooling tower provided for the building backbone A/C line when the building for the data center employs the A/C system with chilled water circulation. Further another embodiment of the present invention, the cooling tower 260 may employ a free water cooling architecture. In the free water cooling architecture, the water contained in the cooling tower 260 may be the water such as well water, river water, and/or groundwater which is cooled or heated by the terrestrial heat if some heating is necessary depending on the natural climate at the location of the data center requires the heating. In alternative embodiment, the cooling tower 260 may be replaced with other suitable cooling facilities such as a turbo type refrigerator or a conventional reciprocal expansion type refrigerator though overall COPs may be lowered with respect to the most preferred embodiment.

The above WCU 230 may prepare the chilled water in the feasible temperature range by the latent heat upon evaporation of the water. The chilled water is then returned to the electronic apparatus 210 through the line 232 again for conducting the heat exchange with the air flow passed through the computing nodes in the electronic apparatus 210.

Thereafter, the air flow 218 after the heat exchange with the chilled water is discharged to the ambient environment so that the present embodiment may reduce an adverse effect on the ambient temperature by the heat generated by the computation. This reduction of the temperature reduces about 50% of the total heat extinction. This reduction contributes to reduction of the building backbone A/C capacity so that maintenance and/or running costs may be reduced while assuring the predetermined computation performance.

Furthermore, in the present embodiment, the water pressure circulated through the electronic apparatus 210 is kept lower than 0.101325 MPa as described hereinabove, and may be reduced as low as 5 kPa (about one-twentieth of the atmospheric pressure). Then the pressure reduction range may range from about 5 kPa to the pressure lower than the atmospheric pressure. Therefore, if the water leak occurs, the leaked water does not come outside of the heat exchanger coil 234 immediately such that the problem of water leak may be reduced. For this purpose, the present invention may include a flow control member for the water. In one embodiment, such flow control member may be the circulation pump 248; in this embodiment, the circulation pump 248 may be selected from a type which does not separate the water in a pressure room or a compartment by vanes or gears for creating one-direction flow for pumping, and the circulation pump 248 may be selected from so-called non-volume type pumps. Such non-volume type pump may be selected, for example, from a turbine pump, a centrifugal pump and/or a screw pump being configured in a canned-type which is suitably applied under a reduced pressure condition. In addition to the above embodiment, further another embodiment for the flow control member is to adopt a water release line disposed at the up-stream line of the heat exchanger coil 234. The water release line is fluid-connected to the evaporator 236 through a pressure sensitive valve. The pressure sensitive valve may be activated less than the atmospheric pressure such that the water flowing in the heat exchanger coil 234 could not leak into the electronic apparatus. The above non-volume type circulation pump and/or the water release line is activated by the pressure sensitive valve.

Furthermore, the circulation pump 248 is illustrated in a single stage in FIG. 2 for the explanatory purpose; however, the circulation pump 248 may be replaced by pump series of the non-volume type pumps attaining multi-stage pumping with a low head/per pump. Since the low head pumps are selected in the multi-stage pumping architecture, the pressure of the chilled water may be kept low with respect to the ambient atmospheric pressure when compared to the pumping of the single stage.

The circulating pumps 252, 266 may be selected from any conventional type considering their performance, because the circulating pumps 252, 266 have the roles to transfer the water in the directions shown in the arrows C and D, respectively.

Figure 3:
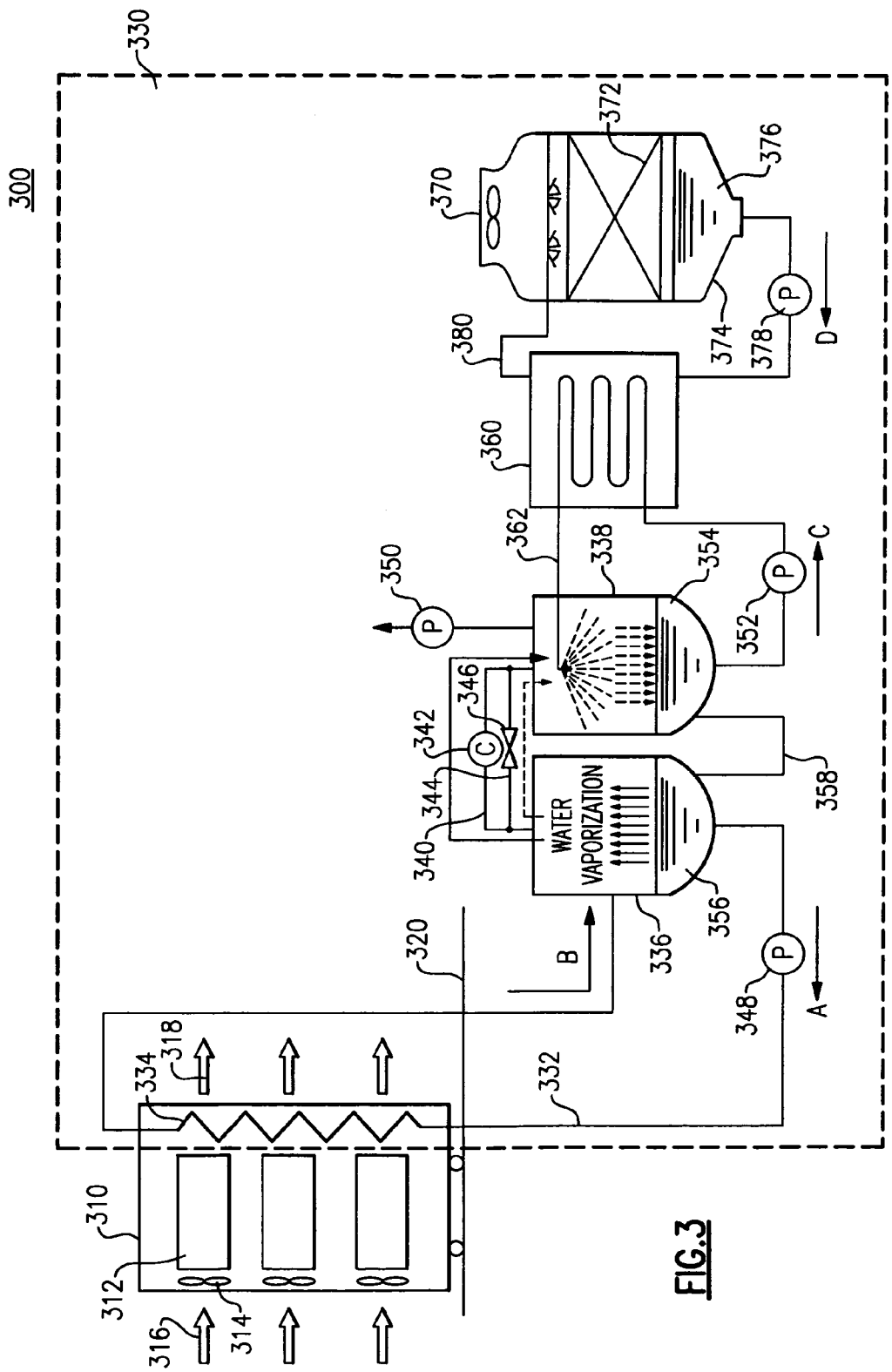
FIG. 3 shows other embodiment of a cooling apparatus.

FIG. 3 shows another embodiment of the cooling apparatus. The cooling apparatus 300 in FIG. 3 has almost same configuration with the cooling apparatus described in FIG. 2; however, the cooling apparatus 300 comprises a heat exchanger tank 360 to which the water from the cooling tower 370 is circulated.

In the second embodiment, the water is circulated through the line 362 to the heat exchanger reservoir 360 in the direction of the arrow C but not to the cooling tower 370. The water is cooled in the heat exchanger reservoir 360 and then, returned to the reservoir 338 through showering members disposed to the line 362.

The water is supplied to the electronic apparatus 310 through the line 332 from the evaporator 336 by the circulation pump 348 which may be constructed in the similar architecture with the embodiment described in FIG. 2. Then, the chilled water removes the heat from the air flow 316 upon the heat exchange in the computing node 312. The cooled air flow 318 is then discharged into the computing room and the heated water is returned to the evaporator 336. Thereafter, the regeneration cycles of the chilled water will be repeated as described in FIG. 2.

In the embodiment in FIG. 3, the cooling tower 370 may be shared with the building backbone A/C line rather than providing an extra cooling tower for the cooling apparatus. In the shared embodiment, the cooling apparatus of the present invention may be added to the electronic apparatus by adding an extra line 380 transferring the water in the arrow D and connecting to the cooling tower 370 for the building A/C line, which is considered to be a minimum effect on the building backbone A/C line. Therefore, the cooling apparatus described in FIG. 3 may further provide the low cost installation of the cooling apparatus to the data center when the data center utilizes a water circulation backbone A/C system. Also in the embodiment in FIG. 3, the cooling tower 260 may be replaced with other suitable cooling facilities such as a turbofan type refrigerator or a conventional type refrigerator, though overall COPs may be lowered with respect to the most preferred embodiment. In this embodiment, the cooling facility conditions the water temperature in the heat exchanger tank 360.

Figure 4:
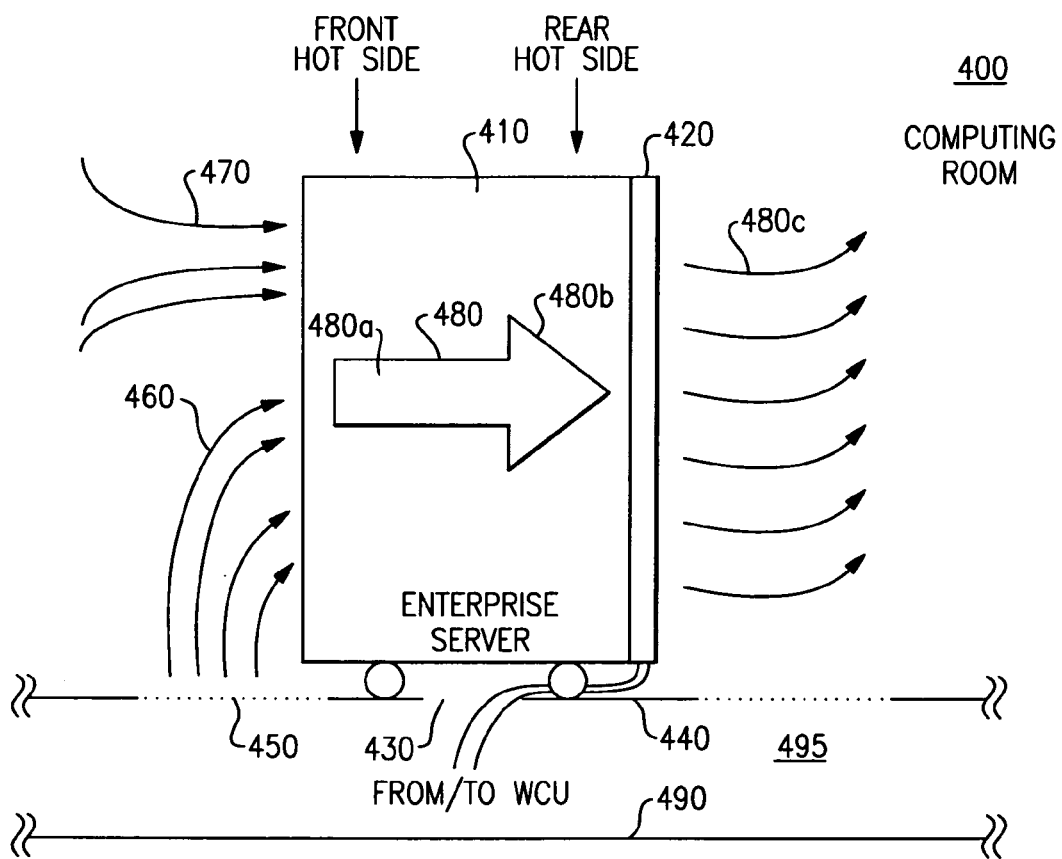
FIG. 4 shows a detailed embodiment of a cooling mechanism according to the present invention.

Now referring to FIG. 4, a detailed embodiment of the cooling mechanism 400 according to the present invention is depicted. The electronic apparatus 410, so called as in the described embodiment, "Enterprise Server" contains inside a plurality of the computing nodes and each of the computing nodes generates heat due to its operation. The electronic apparatus 410 may be in another embodiment a mainframe computer and/or any combination of servers, mainframe computers, and the interface apparatus thereof.

The air 460, 470 in the computing room is drawn into the electronic apparatus 410 by the function of the fan (not shown) from a cold side and passes through and between the computing nodes. The air flowing into the electronic apparatus 410 is heated as the air flow moves in the direction illustrated in the arrow 480. In the arrow 480, the root side 480*a* is a lower temperature side and the tip side 480*b* is a higher temperature side. In FIG. 4, the schematic temperature distribution is illustrated by densities of the hatching therein; as the shading becomes light, the temperature becomes low. Typically, the temperature at the tip side becomes to about 60 Celsius degrees or more due to the heat exchange with the MPUs and/or the CPUs.

In the illustrated embodiment in FIG. 4, the heat exchanger coil 234 or the heat exchanger coil 334 is configured as a part of the door heat exchanger 320 which is attached to the rear side or a front side of the electronic apparatus 410. The electronic apparatus 410 is placed on the floor comprising the floor panel 440 without perforations and the floor panel 450 with perforations.

The floor panel 440 and the perforated floor panel 450 are supported with a sufficient offset from the base floor level 490 to provide the spacing 495 used as a utility space for cooling lines etc. The perforated floor panel 450 allows the cooled air to flow into the computing room as well as the electronic apparatus 410 from the spacing 495. Also at the floor, the opening 430 is provided to pass through the water lines from the cooling apparatus of the present invention.

In the described configuration, the water is introduced by the lines through the opening 430 and the lines for the water are connected to the heat exchanger coil which is an essential member of the DHEX 420. The water is introduced and circulated in the DHEX 420 through the heat exchanger coil. The heated air just passing through the DHEX 420 is subjected to the heat exchange with the water flowing in the heat exchanger coil of the DHEX 420 and is then discharged to the ambient atmosphere in the computing room after cooled down to an adequate temperature as shown by the arrows 480*c*.

Now referring to FIG. 5, another cooling mechanism 500 of the present invention will be explained. In the embodiment illustrated in FIG. 5, most of the configuration for the air and water flows is same with the embodiment described in FIG. 4. In turn, the embodiment of FIG. 5 comprises a pump unit 535 for adding pressure corresponding to the pressure loss during the circulation in the water lines 530. The pump unit 535 ensures to support smooth cycling of the water against the head and the pressure loss in the line while keeping the pressure of the water to be under the ambient atmosphere pressure.

Figure 5:
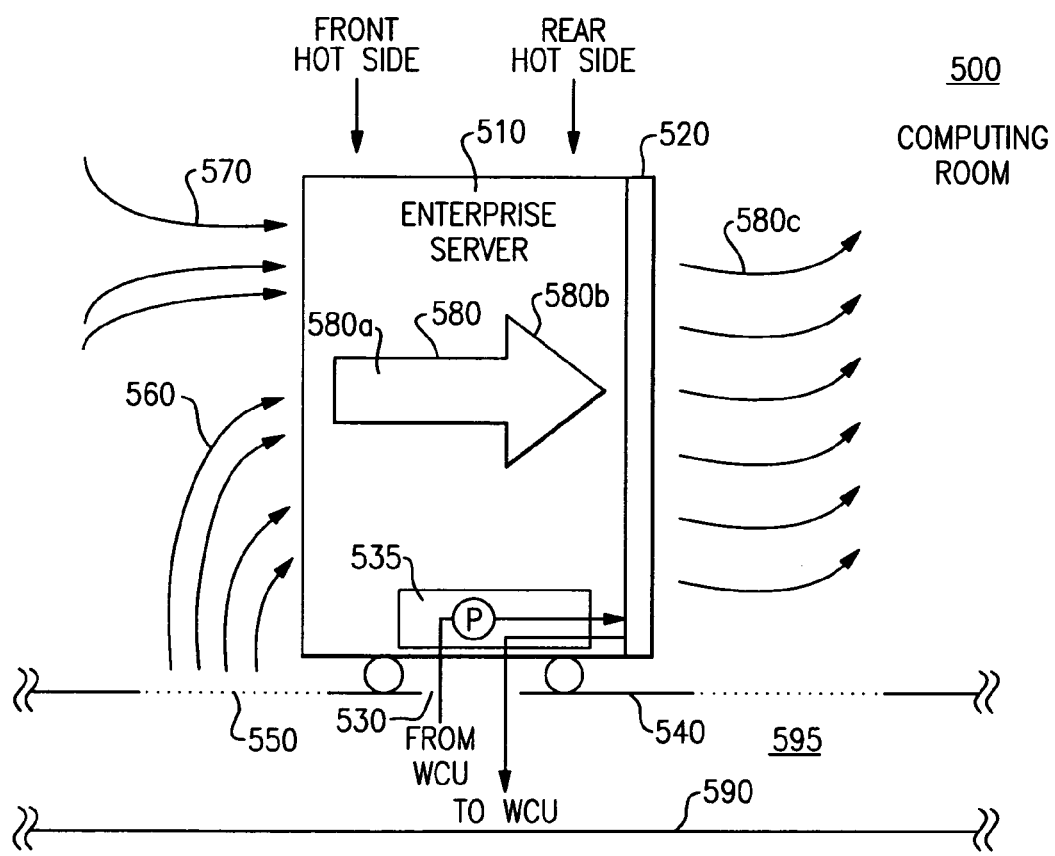
FIG. 5 shows another cooling mechanism of the present invention.
Figure 6A:
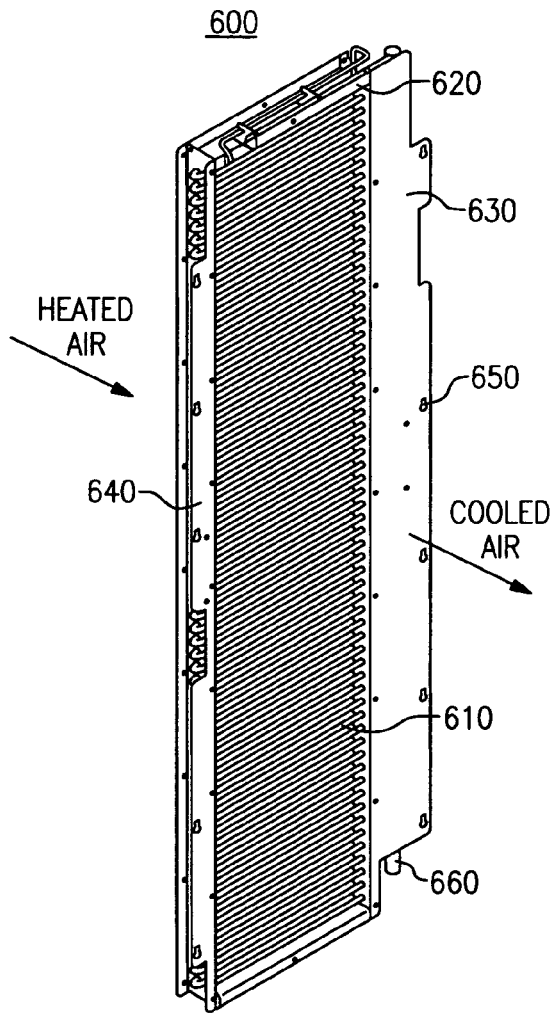
FIG. 6 shows a schematic perspective view of a door heat exchanger (DHEX) panel.
Figure 6B:
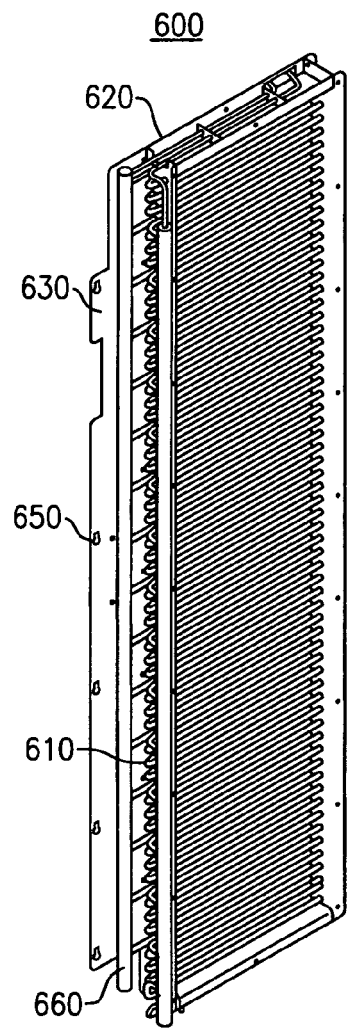

FIG. 6 shows a detailed perspective view of the door heat exchanger (DHEX) panel 600 outlined in FIG. 5. FIG. 6(*a*) shows a front perspective view and FIG. 6(*b*) shows a back perspective view. Here, the term "front" means the side facing outside the casing and the term "back" means the side facing inside the casing of the electronic apparatus. The DHEX panel 600 of FIG. 6 comprises a heat exchanger coil 610, a support frame 620, and a support limb 630. The heat exchanger coil 610 corresponds to the lines 234, 334 shown in FIGS. 2 and 3. The heat exchanger coil 610 has a serpentine structure extending lateral and vertical directions of the DHEX panel 600 to ensure the effective and even heat exchange over an effective area of the DHEX panel 600.

The frame 620 supports securely the heat exchanger coil 610 and the support limbs 630 extend from the support frame 620. The support limbs 630 are detachably fixed to a front and/or rear side of the computing unit enclosing members of the electronic apparatus by fixing means such as screws, sets of bolts and nuts, or quick connectors through a plurality of openings 640, 650. The heat exchanger coil 610 is fluid-communicated to an inner line 660 disposed at the lateral edge of the cooling area through which the water flows into and from the heat exchanger coil 610.

Figure 7A:
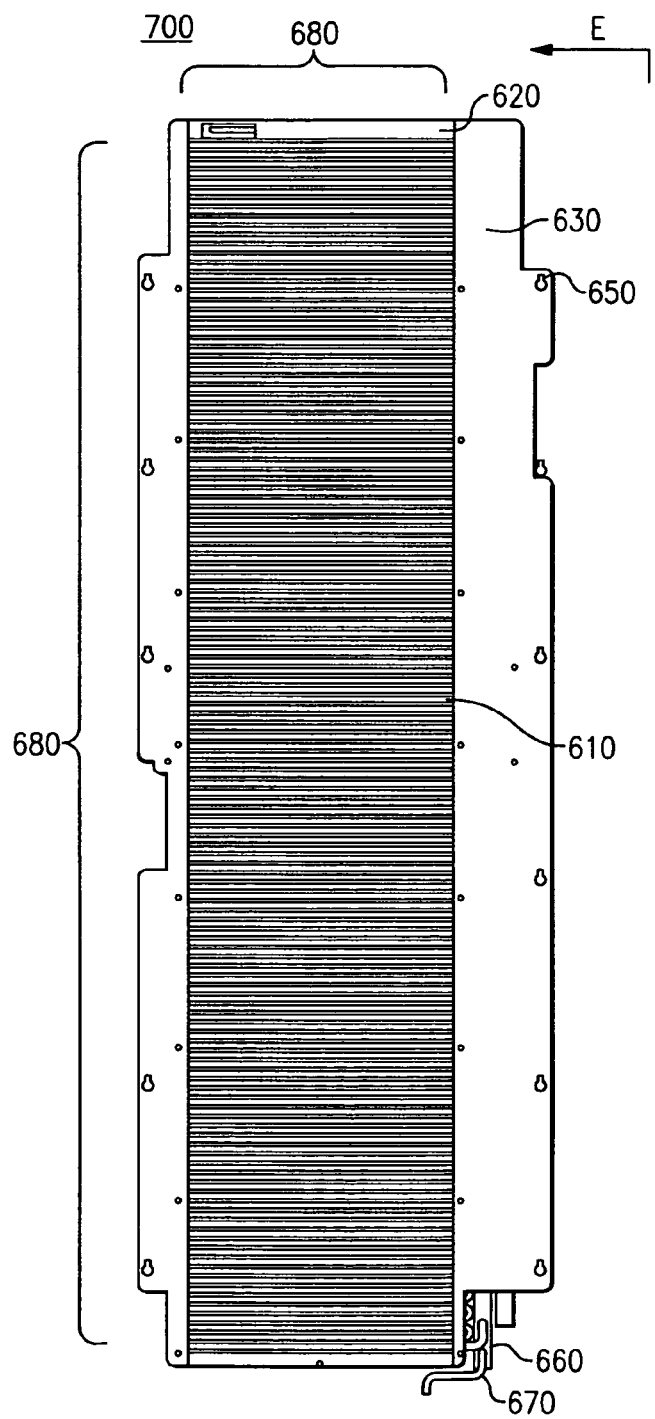
FIG. 7 shows the enlarged structure of a DHEX panel.
Figure 7B:
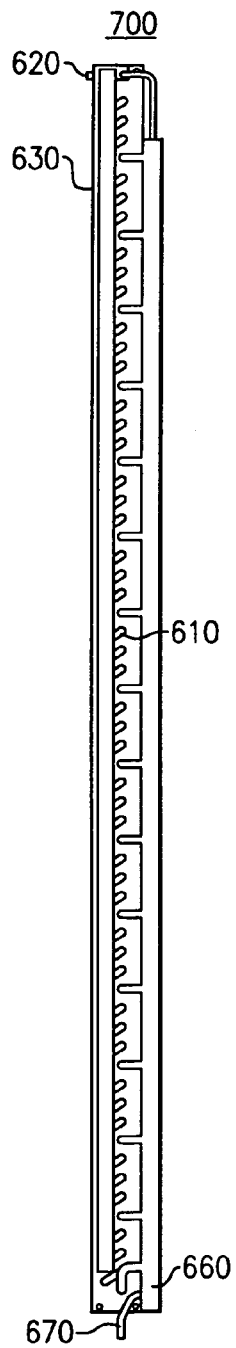

Referring now to FIG. 7, the enlarged structure 700 of the DHEX panel 600 is illustrated. FIG. 7(*a*) is a plane view and FIG. 7(*b*) is a side view of the DHEX panel 600 in the direction of arrow E. As shown in FIG. 7(*a*), the heat exchanger coil 610 densely covers the cooling area 680 so as to avoid unevenness of the heat exchange efficiency and so as to improve the heat exchange performance. In turn, as shown in FIG. 7(*b*), the heat exchanger coil 610 is inclined along with the air flow direction for increasing effective heat exchange areas with the air flow and also for improving the heat exchange performance of the DHEX panel 600.

From the end of the inner line 660, the line 670 is connected to the WCU for allowing the chilled water to be circulated. The inner lines 660 and the line 670 may be directly fixed by welding, soldering or brazing. Alternatively, the inner line 660 and the line 670 are connected to each other by adequate detachable connectors for considering maintenance of the electronic apparatus.

Figure 8:
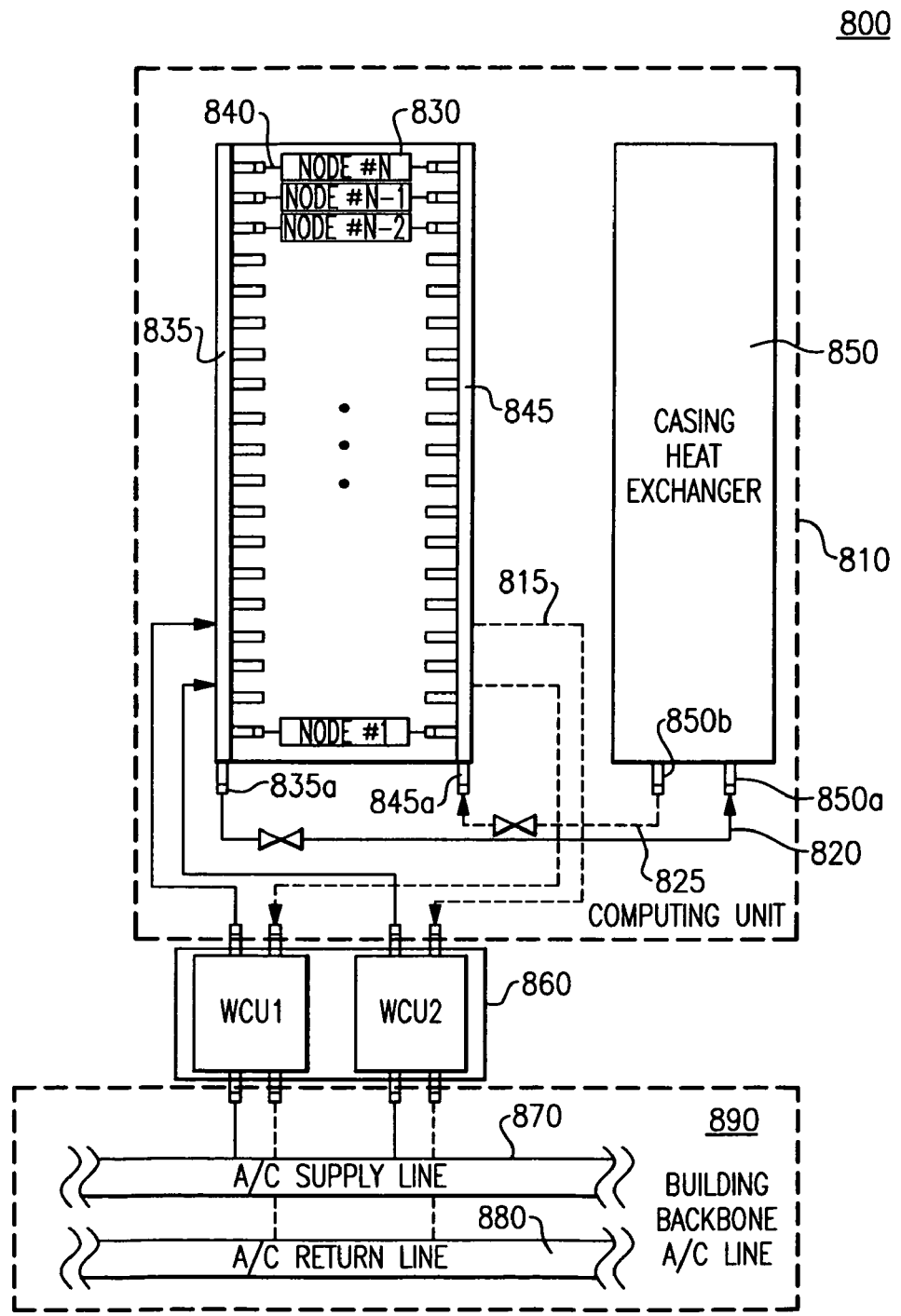
FIG. 8 shows an embodiment of a coolant shielded electronic apparatus.

FIG. 8 shows an exemplary embodiment of the water shielded electronic apparatus 800 to which the chilled water prepared by the water vapor compression is supplied by the present WCU 230 or 330 shown in FIGS. 2 and 3 together with the DHEX panel 600. In the embodiment shown in FIG. 8, the DHEX panel 600 is formed as the rear door heat exchanger and the shielded electronic apparatus 800 comprises the casing 810, i.e., so-called an attachment frame, and the casing 810 encloses racks and the computing nodes, and various lines etc. The same structures depicted in FIG. 8 may be applied in the case of the front door heat exchanger only in the difference whether the position of the heat exchanger panel is disposed at the rear or the front and the air flow directions. Within the casing 810, a pair of sidewalls 835, 845 of the rack, a plurality of computing nodes Node #1-Node #N, and the DHEX panel 850 are assembled to provide the computing function under the heat management condition. The rack supports securely the computing nodes #1-#N within the casing 810.

In the explained embodiment, the DHEX panel 850 is attached to the rear end of the rack by being hinged at the one end of the rack so as to be separately assembled with the rear casing. In the alternative embodiment, the DHEX panel 850 may be assembled to the casing 810 by a hinge at one end of the casing 810 such that handling of the DHEX panel 850 may be made integrally to the movement of the casing 810. To the above shielded electronic apparatus 800, the chilled water is supplied to the computing nodes 830 from the sidewall of the rack by mated connectors. The sidewalls provide water manifold for reserving the water while acting as the flow path of the water. Now referring to FIG. 8, the cooling architecture of the water shield will be detailed.

As the first line system, the water from the A/C supply line 870 are introduced into the WCU1 in the WCU set 860 which comprises the WCU1 and the WCU2 to regenerate the chilled water according to the present invention. The chilled water from the WCU1 is introduced to sidewall 845. The sidewalls 835, 845 comprise a plurality of connector joints facing each other in the same vertical level. To each of the connectors positioned in the same vertical level, a computing node 830 is connected through the connection lines 840 by the connectors which may not leak the water such as water under a nominal condition.

In the described embodiments, the sidewalls 835, 845 support N computing nodes and the chilled water is introduced into the computing nodes from both of the sidewalls 835, 845 forming ladder-wise flow paths. The water flows, for example, into the computing node 830 while conducting the heat exchange between members inside the computing node 830. Then, the water flows out of the computing node 830 and is introduced into the sidewall 845. Then the water flows to the computing node "Node #N-1" in the reversed flow direction and then is introduced again into the sidewall 835. The similar flow paths are provided to a discharge position to which the line 815 to the WCU1 is connected. The water reaches to the discharge point corresponding to the position of discharged from the line 815 to the WCU1.

The second line system 2 is provided by the WCU2 and the fresh chilled water is also flows in the similar to the line system 1; however, the chilled water from the WCU2 are introduced at lower position of the sidewall 835 because the line system 2 is provided for the heat exchange at the DHEX panel 850. The water discharged from the sidewalls 835 are pumped and introduced into DHEX panel 850 from the connector 835*a* to the connector 850*a* attached at the lowest end of the DHEX panel 850 for providing the heat exchange at the DHEX panel 850.

The water introduced into the DHEX panel 850 flows through the heat exchanger coil of the DHEX panel 850 and conducts the heat exchange with the air flow passed through the computing nodes 830 etc. Then, the heated water is discharged from the connector 850*b* and then the heated water is delivered to the sidewall 845 from the connector 845*a* at the lowest end of the sidewall through the line 825. The waste water is finally discharged from a discharge port formed at the sidewall 845 and returned to the WCU1 as the returned water to regenerate cooled fresh water.

The above described water flow is one of possible embodiments considering pressure balances in the line system 1 and the line system 2. It is readily understood by a person skilled in the art that the flow path designs may be adjusted considering particular constructions of the practical case.

Figure 9:
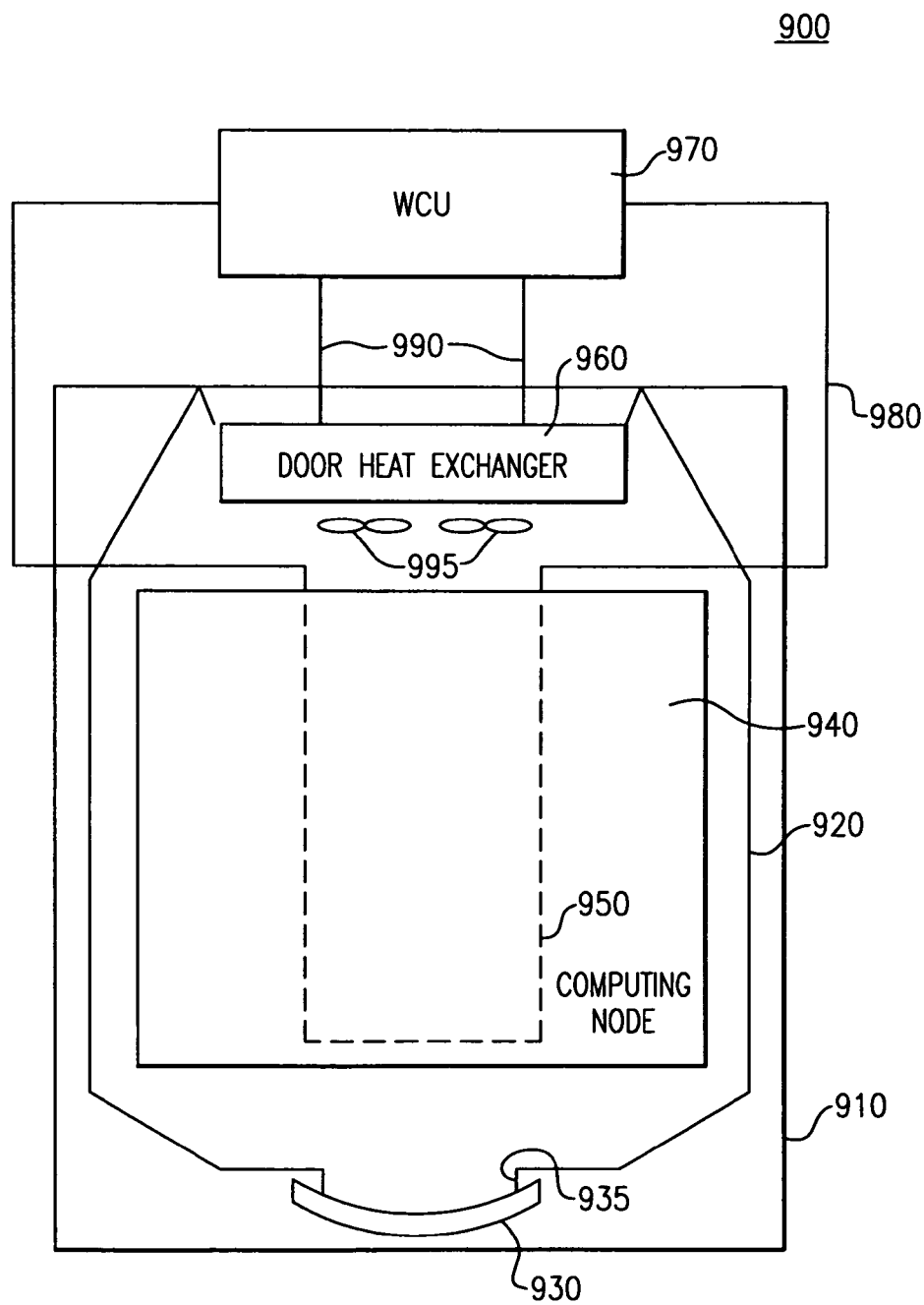
FIG. 9 shows a schematic block diagram of the inside construction of a shielded electronic apparatus shown FIG. 8.

FIG. 9 shows a schematic block diagram 900 of the inside construction of the shielded electronic apparatus 800 shown in FIG. 8. As depicted in FIG. 9, the shielded electronic apparatus 800 generally comprises members in the rectangle 910 and such members comprise the casing 920, the computing nodes 940, and DHEX panel 960. The DHEX panel 960 is retained securely to the shielded electronic apparatus at the front and/or rear side thereof. The DHEX panel 960 may be attached to the rack or the casing 920 as described above. In the described embodiment, the DHEX panel 960 is disposed at the rear side of the electronic apparatus. The casing 920 extends from the front panel 930 with an air intake 935 to the DHEX panel 960 to enclose the members including the computing node 940 etc. The WCU 970 is fluid-communicated to the DHEX panel 960 so as to attain the heat exchange with the air flow and the water and the computing nodes 940 through the lines 980, 990.

In the described embodiment in FIG. 9, the line systems 980, 990 may be designed along with the embodiment described in FIG. 8; however, the WCU 970 may independently supply the water to the DHEX panel 960 and the computing node 940 such that the line system 990 supplies the water to the DHEX panel 960 and the line system 980 supplies the water to the computing node 940.

The line system 980 are extended from the WCU 970 to the inside of the computing node 940 as indicate by the dashed line 950 and further extends to the WCU 970 to return the water to the WCU 970 from the computing node 940. The extended line inside the computing node 940 provides the cold section therein so that the cooling air drawn by the fans 995 into the computing node 940 may be cooled by the cold section when the cooling air passes through therein. The cold section may be formed as a line-path of the cooling pipe included in the line system. Alternatively, the cold section may be formed as a cold plate on which the MPUs etc. are placed in the heat exchange relations.

Figure 10:
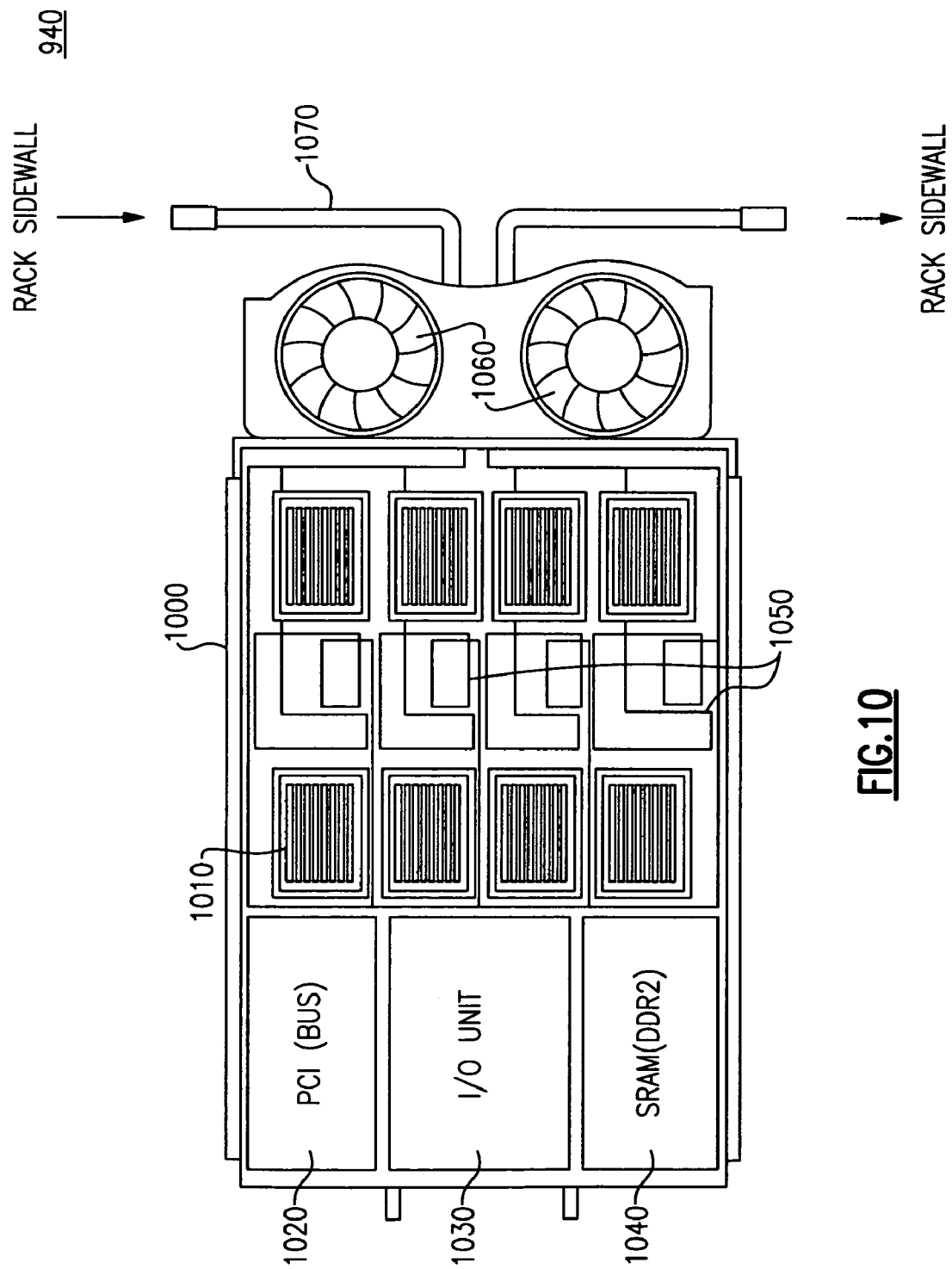
FIG. 10 shows a schematic plane view of a computing node.

Now referring to FIG. 10, a plane view of the computing node 840 is illustrated. The computing node 840 encloses several computing elements such as the CPUs 1010, a PCI bus unit 1020, an I/O unit 1030, and the memory (SRAM in DDR2 specification 1040). Inside the computing node 840, the cooling pipe is extended in a juxtaposed arrangement along to the thickness direction of the computing node 840, i.e., the vertical direction to the plane of the drawing and provides the cold section 1050. In the described embodiment, the computing node 940 includes a plurality of CPUs 1010 and a cooling fin is attached to each of the CPUs 1010 for improving the air cooling efficiency. The CPUs 1010 are operated in a cooperation mode so called as a multi-core or CPU grid architecture. Although in the described embodiment the CPUs 1010 are implemented in 8 CPU nodes, there is no substantial limitation for CPU or MPU numbers included in the computing node 840 according to the present invention.

To the cooling pipe forming the cold section 1050, the lines 1070 are fluid-communicated such that the water from one of the rack sidewall may be introduced and the water from the computing core may be returned to another rack sidewall after the heat exchange scheme described above. The computing node 840 further comprises the fans 1060 in order to cause the cooling air flow inside the computing node 840 while conducting the air cooling of the elements therein.

Figure 11:
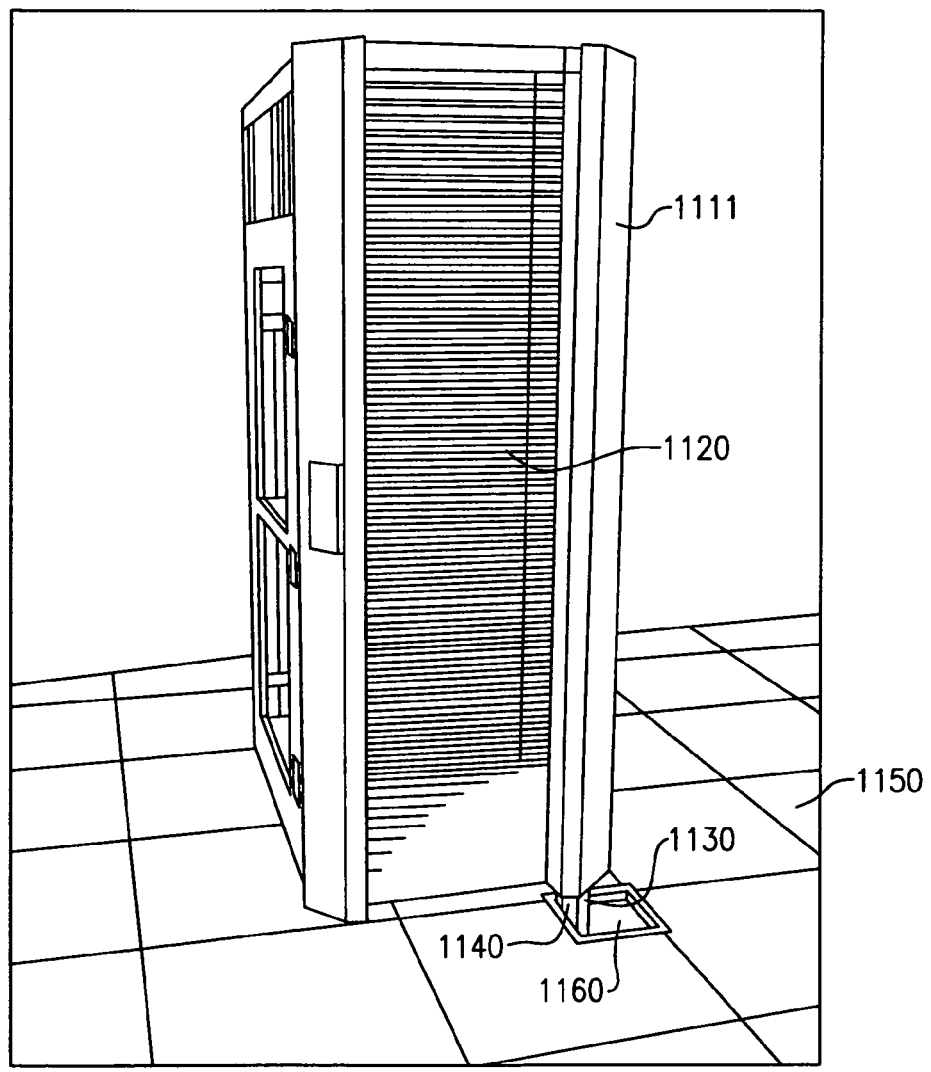
FIG. 11 shows a typical implementation embodiment of the shielded electronic apparatus 1100 viewed from the rear side thereof.

FIG. 11 shows a typical implementation embodiment of the shielded electronic apparatus 1100 viewed from the rear side thereof. In the described shielded electronic apparatus 1100 is implemented as an enterprise server 1100 for handling valuable enterprise information, database information, or Internet information etc. The casing 1111 securely holds the DHEX panel 1120 at the rear end of the enterprise server 1100 which is positioned on a particular position of the floor 1150.

The floor 1150 has the opening 1160 for passing through the water lines 1130, 1140 and other utility lines from the space provided under the floor 1150. For example, the water line 1130 supplies the chilled water from the WCU and the water line 1140 returns the waste water to the WCU for regenerating the chilled water. It may be possible to adopt the perforated floor together with the cooling apparatus of the present invention for readily employing the already constructed cooling apparatus; alternatively only the cooling apparatus of the present invention may be installed when the environment of the computing room and the cooling capacity of the data center may permit such installation.

Figure 12:
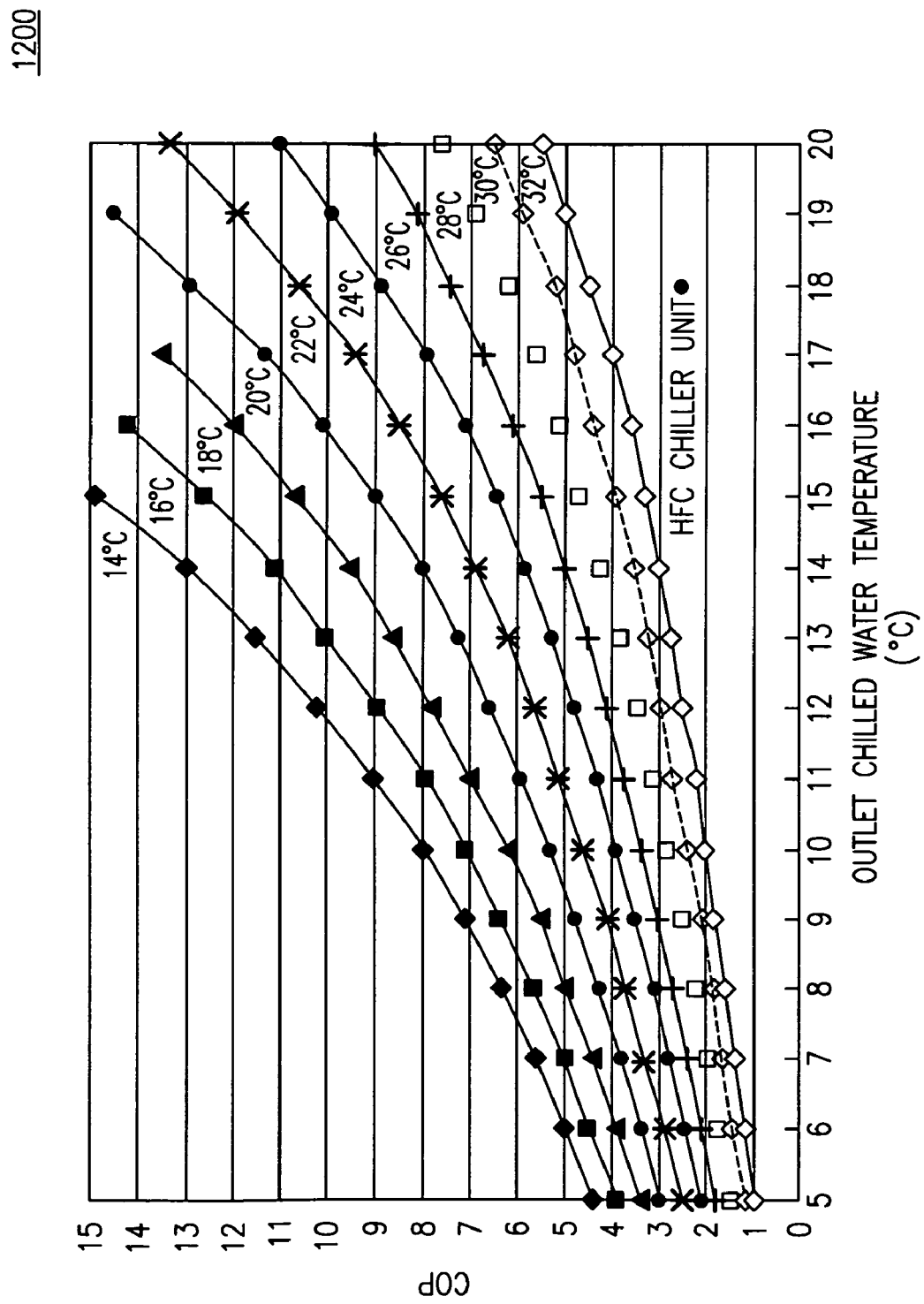
FIG. 12 shows the cooling performance of the cooling apparatus when water is used as the coolant.

Here, referring to FIG. 12, a cooling performance of the cooling apparatus will be described when the water is used as the coolant. FIG. 12 shows the results of the cooling performance curve 1200 represented by values of COP (Coefficient of Performance) against input water temperature vs. output water temperature. The ordinate represents the COP value and the abscissa represents the output water temperature. The experimental curves represent the input water temperature. The COP value was computed using the well-known formula as below:

$$COP = COOLING\ CAPACITY(kW)/CONSUMPTION\ POWER(kW)$$

wherein the COOLING CAPACITY is determined by heat sources enclosed in the space, and the COOLING CONSUMPTION POWER is the electronic power to address the heat exhausted by the heat sources. Hence, higher values of COP means high cooling efficiency.

As shown in FIG. 12, the cooling apparatus of the present invention, the COP values become smaller as the outlet water temperature become high or the input water temperature becomes low. These observations may be partly interpreted as the water with higher temperature requires large electric power for cooling the water to a set temperature when the input water temperature is assumed same. Alternatively, when the input water temperature is lower than a target outlet temperature, i.e., 18 Celsius degree, then the water must warm the input water and then, the electric power consumption may be low to contribute the increase of COP value.

As described hereinabove, the temperature of the water lower than a given value will not be desirable because of the condensation of water around the limes or coils. In this regard, the temperature of the water may range, in the most preferable embodiment, from about 10 Celsius degrees to 20 Celsius degrees considering normal temperature and humidity conditions in the computing room. Now, for example, it is assumed that the water at 14 Celsius degrees is requested. In this case, the COP values of the present embodiment ranges from about 4.5 to more than 15 as shown in FIG. 12.

In turn, the comparative example using a conventional HFC chiller unit, the COP value for generating the cooling water at 18 Celsius degrees is about 3.5. Although the COP values shown in FIG. 12 vary with respect to input and outlet water temperatures, the difference is quite significant because the cooling apparatus is sophisticated to the cooling of the electronic apparatus and/or the cooling of the data center. As described above, in order to avoid water condensation, the water temperature is desirable to be lower than the input water temperature by several Celsius degrees or about 20 Celsius degrees at most. In this temperature range, the cooling apparatus of the present invention, therefore, can provide sufficient cooling performance in the electronic apparatus with the excellent cooling efficiency.

Figure 13:
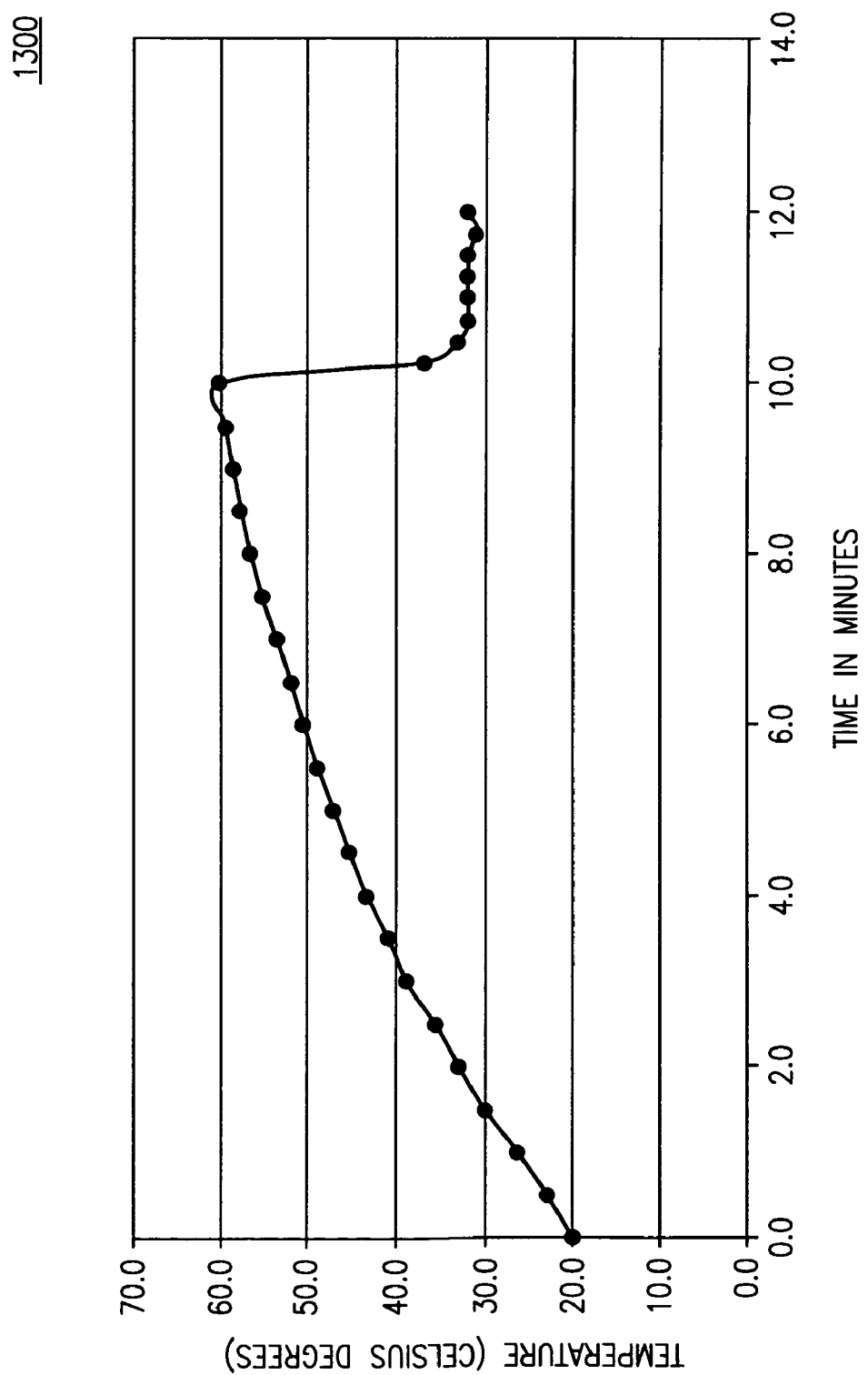
FIG. 13 shows another graph as an example for reducing the temperature from the electronic apparatus.

FIG. 13 shows another graph 1300 as an example for reducing the temperature from the electronic apparatus. In the graph 1300, the ordinate represents the temperature (Celsius degree) exhausted from the rear end of the electronic apparatus and the abscissa represents the time (min) after starting the operation of the electronic apparatus.

As shown in FIG. 13, the out put air temperature gradually increased from about 20 Celsius degrees to about 60 Celsius degrees only in about 10 min. This temperature was fairly high with respect to the ambient temperature to be about 20 Celsius degrees. Then, at the operation time at 10 min., the water circulation to the DHEX panel was started. As shown in FIG. 13, the temperature of the discharged air flow promptly decreases from about 60 Celsius degrees to about 30 Celsius degrees; this means the heat load of the computing unit can be reduced to about one-half with respect to the conventional computing unit.

Further to the above, the inventors have conducted a brief test for improving carbon dioxide exhaust by using the present cooling apparatus. The DHEX panel can remove up to 15 kVA (about 50,000 BTU: British Thermal Unit) of heat coming out of the back of the electronic apparatus that is about 28 kVA. Therefore, the implementation of the cooling apparatus with the DHEX panel may reduce the heat problem in the data center and/or maintenance costs of the data center due to electric power consumption as well as the amount of carbon dioxide exhaust.

Furthermore, the present invention may reduce the overall electronic power consumption by lowering the maintenance costs of large scale computing facilities such as a data censer of enterprises, government organizations, and/or scientific and technology organizations etc. while maintaining computing capacities and while ensuring the robust structure in the electronic apparatus. In addition to the above outstanding advantages, the maintenance costs for employing anti-corrosion additives and for managing for water quality may be avoided such that long-term maintenance costs may be reduced.

As described hereinabove, the present invention has been so-far described based on specific embodiments. However, the present invention is not limited to the above-described specific embodiments. It is appreciated for a person skilled in the art that there may be a lot of another embodiments, addition, deletion, alternative embodiment based on the teachings of the present description. However, the scope of the present invention is only limited by claims attached hereinabove.

The invention claimed is:

1. A cooling apparatus for an electronic apparatus including a semiconductor element, said cooling apparatus comprising: an evaporator containing a coolant and evaporating said coolant under a reduced pressure lower than an ambient pressure to generate a chilled coolant; a condenser regenerating said coolant from a vapor of said coolant and being fluid-communicated with said evaporator through a bypass line; a circulating pump and a line supplying said chilled coolant to a heat exchange area of said electronic apparatus to conduct a heat exchange with an air flow that has passed over said semiconductor element and returning said coolant after said heat exchange to said evaporator; and a flow control member disposed at an up-stream side of said heat exchange area, wherein a pressure of said coolant is kept under said ambient pressure at said heat exchange area through said flow control member.

2. The cooling apparatus of claim 1, wherein said first bypass line includes a compressor for returning said vapor of said coolant to said condenser and said cooling apparatus further comprises a second bypass line including a valve for controlling said reduced pressure.

3. The cooling apparatus of claim 2, wherein a vacuum pump is connected to said condenser to balance a pressure inside said condenser.

4. The cooling apparatus of claim 3, wherein said coolant in said condenser is circulated to a cooling facility or a heat exchanger tank supported by a cooling facility for conditioning a temperature of said coolant.

5. The cooling apparatus of claim 1, wherein said coolant is water and said semiconductor element is at least one of a micro-processor unit and a central processor unit.

6. The cooling apparatus of claim 1, wherein said electronic apparatus is placed in a computing room of a data center managing a computation of computers.

7. The cooling apparatus of claim 1, wherein said electronic apparatus comprises a computing unit enclosing the semiconductor element, a memory, an I/O unit, a bus for computing information, and a cold section disposed in said computing unit, said heat exchange area separately prepared as a door heat exchanger panel detachably attached to said electronic apparatus, and said line of said coolant extending into said cooling section.

8. The cooling apparatus of claim 6, wherein said coolant is water and a temperature of said water is lower than an ambient air temperature of said cooling apparatus throughout said cooling apparatus.

9. The cooling apparatus of claim 6, wherein said cooling apparatus comprises an environment monitoring facility in a computing room including a controller for detecting at least one temperature selected from an ambient air temperature in said computing room, temperatures of computing nodes, temperatures of said electronic apparatus and a temperature of said semiconductor element through detection lines, wherein said controller controls elements of said cooling apparatus such that an ambient temperature in said computing room is at a predetermined level while maintaining said temperature of said coolant from 10 Celsius degrees to about said temperature in said computing room.

10. A method for cooling an electronic apparatus including a semiconductor element, said method comprising: in an evaporator with a reduced pressure lower than an ambient pressure, generating a chilled coolant; circulating said chilled coolant through a line passing though a heat exchange area of said electronic apparatus at a hot side of said electronic apparatus;

conducting a heat exchange at said heat exchange area with an air flow that has passed over said semiconductor element; and returning said coolant after said heat exchange and via a bypass line to a condenser for regenerating said coolant from a vapor of said coolant, wherein a pressure of said coolant is kept under said ambient pressure at said heat exchange area though a flow control member for said coolant.

11. The method of claim 10, wherein said method further comprises the step of:

controlling said reduced pressure by a compressor connected to a first bypass line for returning said vapor and a valve connected to a second bypass line.

12. The method of claim 11, wherein said method further comprising the step of:

balancing a pressure inside said condenser by a vacuum pump connected to said condenser.

13. The method of claim 12, wherein said method comprising the steps of:

circulating said coolant in said condenser through a cooling facility or a heat exchanger tank supported by a cooling facility for conditioning a temperature of said coolant.

14. The method of claim 10, wherein said coolant is water, said semiconductor element is at least one of a micro-processor unit and a central processor unit and said electronic apparatus is placed in a computing room of a data center managing a computation of computers, and wherein said method further comprises the steps of:

detecting at least one temperature selected from an ambient air temperature in said computing room, temperatures of computing nodes, temperatures of said electronic apparatus and a temperature of said semiconductor element through detection lines;

and controlling an ambient temperature in said computing room at a predetermined level while maintaining said temperature of said coolant from 10 Celsius degrees to about said temperature in said computing room.

* * * * *